(12) United States Patent
Narayanan et al.

(10) Patent No.: US 10,319,908 B2
(45) Date of Patent: Jun. 11, 2019

(54) INTEGRATIVE RESISTIVE MEMORY IN BACKEND METAL LAYERS

(71) Applicant: Crossbar, Inc., Santa Clara, CA (US)

(72) Inventors: Sundar Narayanan, Cupertino, CA (US); Steve Maxwell, Sunnyvale, CA (US); Natividad Vasquez, Jr., San Francisco, CA (US); Harry Yue Gee, Milpitas, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/636,363

(22) Filed: Mar. 3, 2015

(65) Prior Publication Data

US 2015/0318333 A1   Nov. 5, 2015

Related U.S. Application Data

(60) Provisional application No. 61/987,415, filed on May 1, 2014.

(51) Int. Cl.
*H01L 45/00* (2006.01)
*H01L 27/24* (2006.01)
(Continued)

(52) U.S. Cl.
CPC .... *H01L 45/1675* (2013.01); *H01L 21/76877* (2013.01); *H01L 23/5226* (2013.01);
(Continued)

(58) Field of Classification Search
CPC ... H01L 27/2472; H01L 27/249; H01L 45/04; H01L 45/16; H01L 45/1608;
(Continued)

(56) References Cited

U.S. PATENT DOCUMENTS 7,018,863 B2 * 3/2006 Moore ................. H01L 45/085
257/530
2004/0159828 A1 8/2004 Rinerson et al.
(Continued)

FOREIGN PATENT DOCUMENTS

CN  102576709 A   7/2012
TW  200945642 A   11/2009
(Continued)

OTHER PUBLICATIONS

Taiwanese Office Action for Taiwanese Patent Application No. 104113664 dated Aug. 3, 2016, 10 pages (including translation).
(Continued)

*Primary Examiner* — James C Niesz
(74) *Attorney, Agent, or Firm* — Wegman, Hessler

(57) ABSTRACT

Providing for a memory device having a resistive switching memory integrated within backend layers of the memory device is described herein. By way of example, the resistive switching memory can be embedded memory such as cache, random access memory, or the like, in various embodiments. The resistive memory can be fabricated between various backend metallization schemes, including backend copper metal layers and in part utilizing one or more damascene processes. In some embodiments, the resistive memory can be fabricated in part with damascene processes and in part with subtractive etch processing, utilizing four or fewer photo-resist masks. Accordingly, the disclosure provides a relatively low cost, high performance embedded memory compatible with a variety of fabrication processes of integrated circuit foundries.

20 Claims, 16 Drawing Sheets

(51) Int. Cl.
  *H01L 23/522* (2006.01)
  *H01L 21/768* (2006.01)
  *H01L 23/532* (2006.01)
  *H01L 27/10* (2006.01)
  *H01L 27/092* (2006.01)
(52) U.S. Cl.
  CPC ...... *H01L 23/53238* (2013.01); *H01L 27/101* (2013.01); *H01L 27/2436* (2013.01); *H01L 27/2463* (2013.01); *H01L 45/085* (2013.01); *H01L 45/1233* (2013.01); *H01L 45/1253* (2013.01); *H01L 45/145* (2013.01); *H01L 45/146* (2013.01); *H01L 45/148* (2013.01); *H01L 45/16* (2013.01); *H01L 45/1608* (2013.01); *H01L 21/76807* (2013.01); *H01L 21/76816* (2013.01); *H01L 27/092* (2013.01); *H01L 27/2409* (2013.01); *H01L 2924/0002* (2013.01)
(58) Field of Classification Search
  CPC .............. H01L 45/1641; H01L 45/1666; H01L 45/1675; H01L 45/1233; H01L 21/76877; G11C 13/0002; G11C 2213/34
  See application file for complete search history.

(56) References Cited

U.S. PATENT DOCUMENTS

| | | | |
|---|---|---|---|
| 2004/0202041 A1 | 10/2004 | Hidenori | |
| 2009/0189136 A1* | 7/2009 | Matsuzaki | H01L 27/2436 257/2 |
| 2010/0308463 A1 | 12/2010 | Yu et al. | |
| 2011/0272664 A1* | 11/2011 | Tada | H01L 27/228 257/4 |
| 2012/0199805 A1* | 8/2012 | Sorada | H01L 27/101 257/2 |
| 2012/0305874 A1* | 12/2012 | Herner | H01L 27/1021 257/2 |
| 2013/0140515 A1* | 6/2013 | Kawashima | H01L 45/085 257/4 |
| 2013/0221316 A1 | 8/2013 | Greene et al. | |
| 2014/0042567 A1* | 2/2014 | Jung | H01L 43/08 257/421 |

FOREIGN PATENT DOCUMENTS

| | | |
|---|---|---|
| TW | 201117321 A | 5/2011 |
| TW | 201240104 A | 10/2012 |

OTHER PUBLICATIONS

Chinese Office Action for Chinese Patent Application No. 201510221263.X dated Sep. 15, 2017, 7 pages (including English translation).

Taiwanese Office Action for Taiwanese Patent Application No. 104113664 dated Feb. 24, 2017, 36 pages (including English translation).

Notice of Allowance for Taiwan Patent Application No. 104113664 dated Dec. 10, 2018.

\* cited by examiner

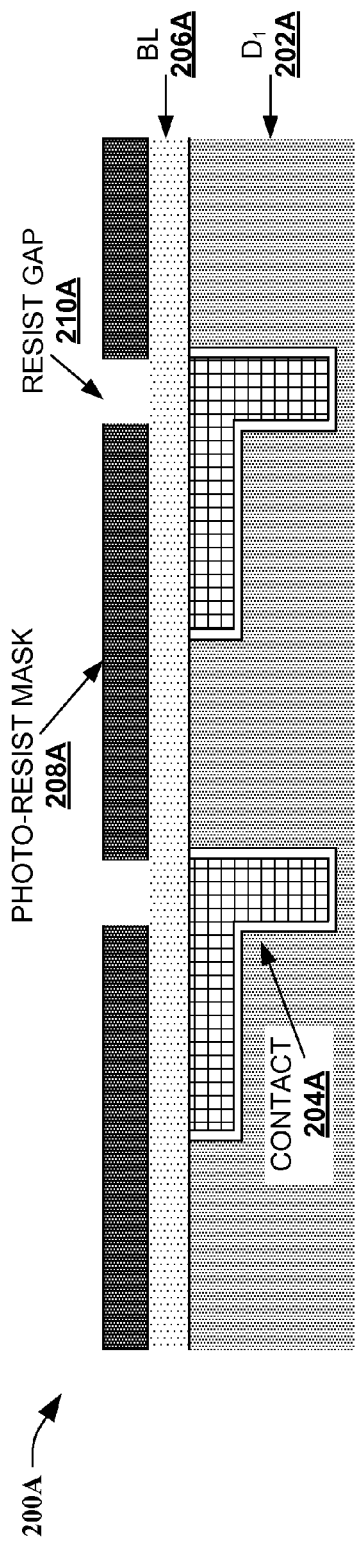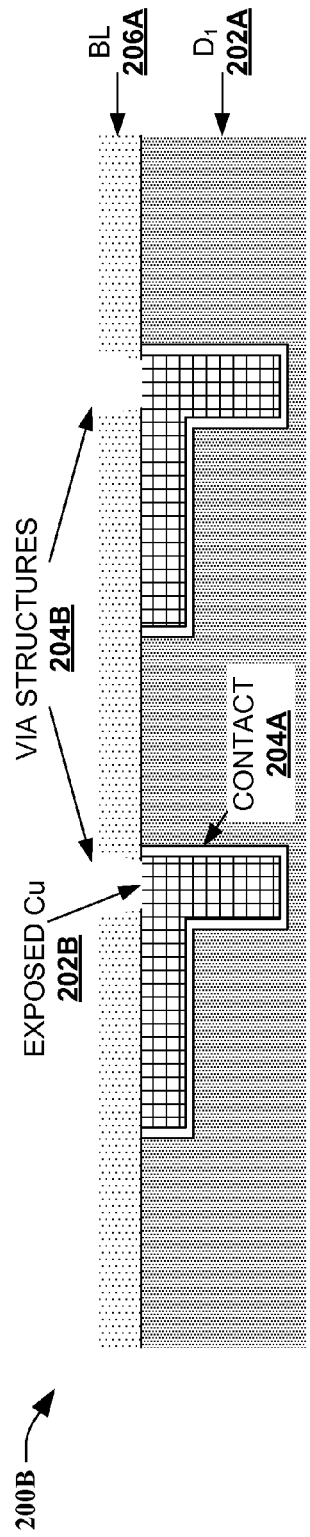

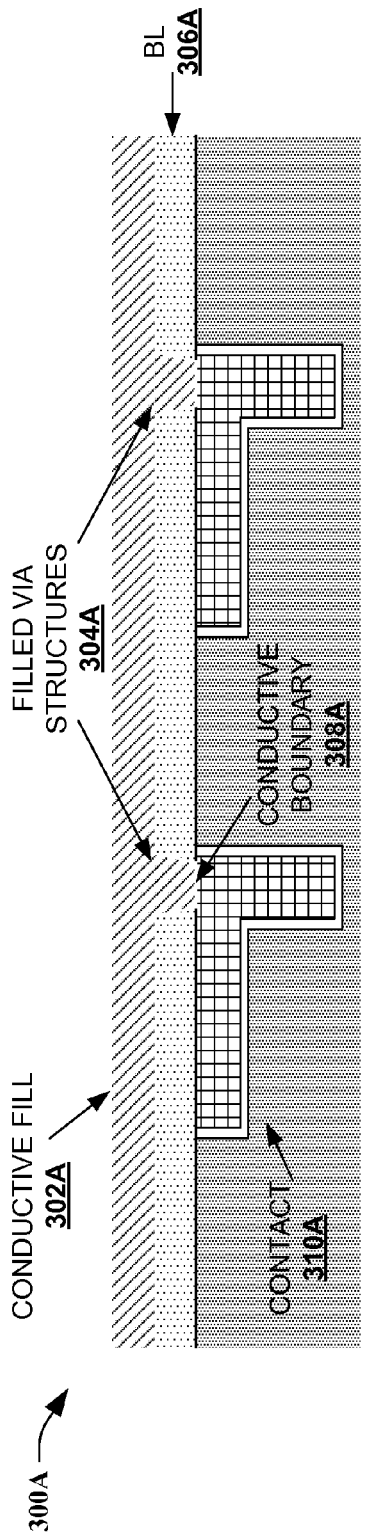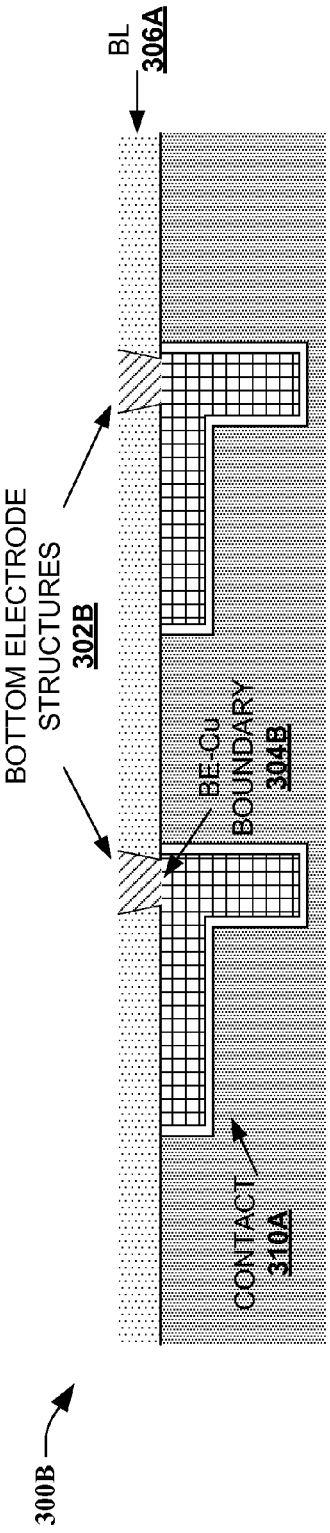

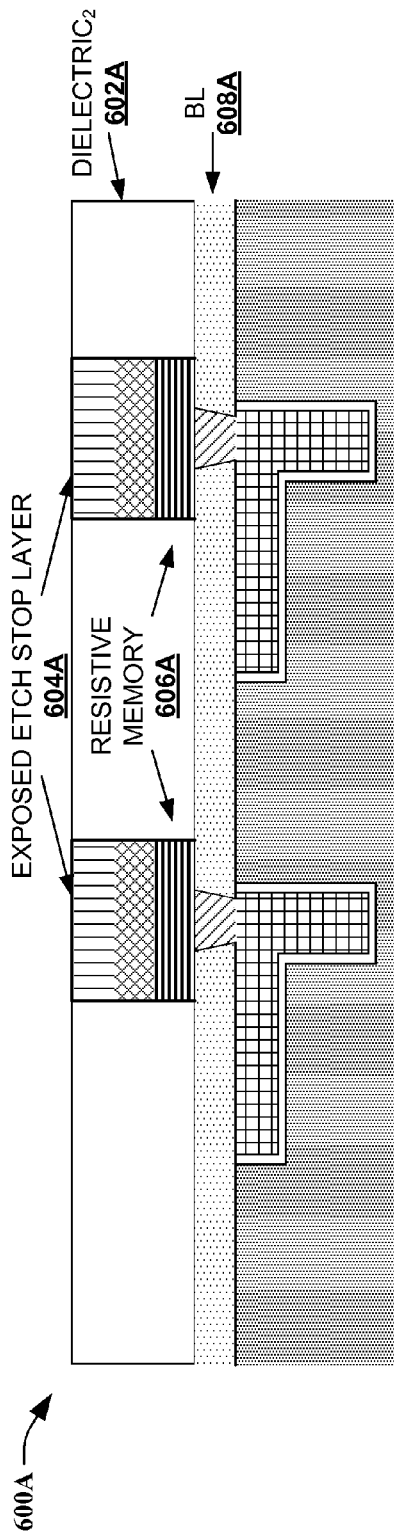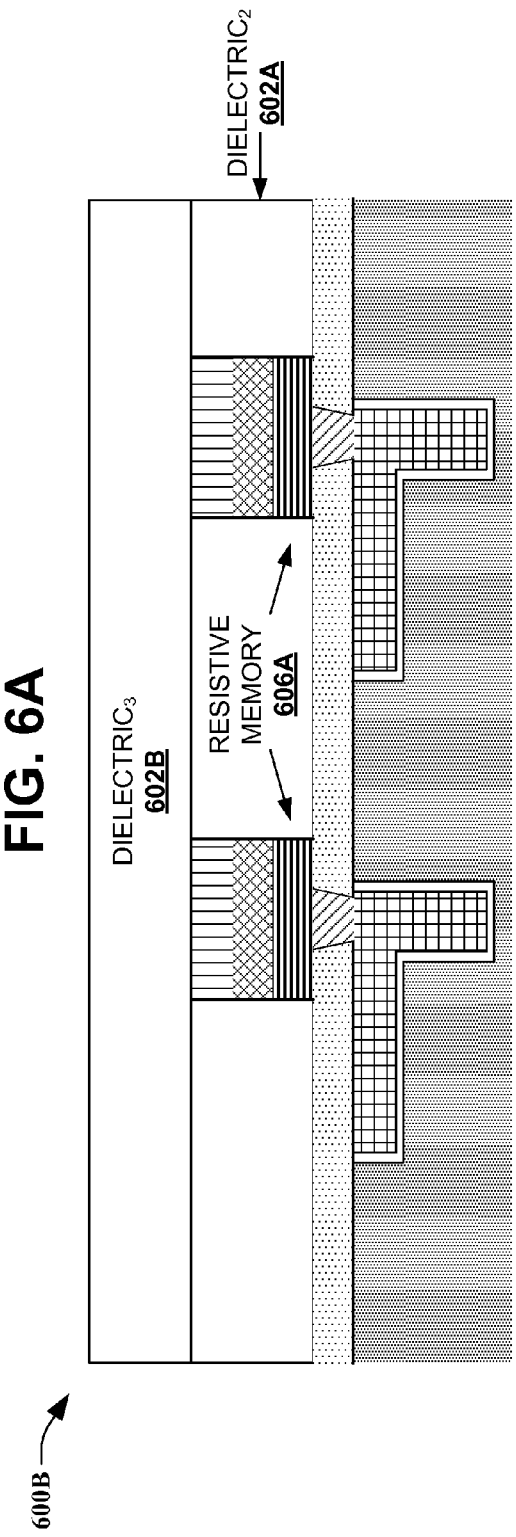
FIG. 6A
FIG. 6B

INTEGRATIVE RESISTIVE MEMORY IN BACKEND METAL LAYERS

CROSS-REFERENCE TO RELATED APPLICATIONS

This application claims the benefit of U.S. Provisional Application Ser. No. 61/987,415, filed May 1, 2014, and entitled "METHOD AND STRUCTURE OF INTEGATING RESISTIVE MEMORY IN COPPER BACKEND METAL LAYERS", the entirety of which is expressly incorporated by reference herein, for all purposes.

TECHNICAL FIELD

This disclosure relates generally to electronic memory; for example, the disclosure describes a memory device having scalable resistive memory structures integrated between copper backend metal layers of the memory device.

BACKGROUND

A recent innovation within the field of integrated circuit technology is two-terminal memory. Two-terminal memory technology is contrasted, for instance, with gate-controlled memory in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventors of the present disclosure are further aware of a variety of two-terminal memory technologies, such as phase-change memory, magneto-resistive memory, as well as others.

One two-terminal memory expected to have promising physical characteristics is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventors endeavor to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In one or more embodiments, the subject disclosure provides a memory device having a resistive switching memory integrated within backend layers of the memory device. The resistive switching memory can be embedded memory such as cache, random access memory, or the like, in various embodiments. In further embodiments, the resistive memory can be fabricated between backend copper metal layers of the memory device, utilizing at least one damascene process. In some embodiments, the resistive memory can be fabricated in part with the damascene process(es) and in part with subtractive etch processing (e.g., photo-resist mask and etch process). For example, some embodiments fabricate the resistive memory with no more than four photo-resist masks. In at least one embodiment, the resistive memory can be fabricated with no more than two photo-resist masks.

In a further embodiment, the subject disclosure provides a memory device having an array of resistive memory embedded within a back-end-of-line copper metallization scheme of the memory device. Furthermore, the array of resistive memory can be provided without changing or substantially changing inter-layer dielectric thicknesses of the copper metallization scheme. Accordingly, the resistive memory can be embedded within the memory device while maintaining electrical models associated with front-end-of-line electronic components of the memory device.

In one or more additional embodiments, resistive memory can be embedded between backend copper metal layers of a memory device. Further, the resistive memory can be fabricated with multiple layers, comprising a first subset of layers having a first lateral dimension (e.g., width, diameter, etc.). Additionally, the resistive memory can comprise a second subset of layers having a second lateral dimension, larger than the first lateral dimension that covers or substantially covers the first subset of layers. In at least one embodiment, the first subset of layers can be formed at least in part with a damascene process, mitigating leakage paths along a sidewall of the first subset of layers. Moreover, the second subset of layers can be formed with a subtractive etch process to reduce cost of fabricating the embedded resistive memory.

In further embodiments, the subject disclosure provides a memory device. The memory device can comprise a substrate comprising one or more electronic devices formed at last in part within the substrate, a dielectric layer above the substrate and a via structure within the dielectric layer lined with a diffusion mitigation layer and filled with copper metal, wherein the via structure is formed by removal of a portion of the dielectric layer. Furthermore, the memory device can comprise a blocking layer formed over the dielectric layer and the via structure, and that mitigates diffusion of copper material into or through the blocking layer and a second via structure formed within the blocking layer exposing a top surface of the copper metal within the via structure. In one or more embodiments the memory device can additionally comprise a conductive plug formed via a damascene process within the second via structure and in electrical contact with the top surface of the copper metal. In further embodiments, the memory device can comprise a memory cell stack deposited over the blocking layer and over the conductive plug within the second via structure, wherein the memory cell stack is pattern and etched to form a discrete two-terminal memory device over the via structure and having the conductive plug as a bottom terminal of the discrete two-terminal memory device.

In additional embodiments of the present disclosure, provided is a method for forming a resistive memory cell. The method can comprise providing a semiconductor substrate having a plurality of complementary metal oxide semiconductor devices formed thereon, and having a plurality of exposed copper conductor contact regions and forming a blocking layer over the semiconductor substrate and copper conductor contact regions. The method can further comprise forming a plurality of bottom electrodes within the blocking layer and in electrical contact with respective ones of at least a subset of the copper conductor contact regions and disposing a set of resistive memory cell layers above the blocking layer, which can additionally comprise disposing a resistive switching material above and in electrical contact with the plurality of bottom electrodes, and disposing an active metal material above and in electrical contact with the resistive switching material. In addition to the foregoing, the method can comprise disposing an etch stop layer including discrete etch stop segments over portions of the active metal material and etching the set of resistive memory cell layers between the discrete etch stop segments to form a plurality of resistive memory structures. Further, the method can comprise depositing a first dielectric layer above and between the plurality of resistive memory structures and etching the first dielectric layer to expose the etch stop layer of the plurality of resistive memory structures. Moreover, the method can comprise depositing a second dielectric layer above at least a portion of the first dielectric layer and above the etch stop layer of the plurality of resistive memory structures and forming and patterning a mask layer above discrete mask portions of the second dielectric layer. Further to the above, the method can comprise etching at least a portion of the second dielectric layer in response to the mask layer to form a plurality of contact vias that respectively expose at least a portion of the discrete etch stop segments of the plurality of resistive memory structures and forming a copper metal layer within the plurality of contact vias above and respectively in electrical contact with the portion of the discrete etch stop segments of the plurality of resistive memory structures.

In one or more other embodiments of the present disclosure, there is provided a method of forming a device including embedded resistive memory. The method can comprise providing a substrate having a plurality of CMOS devices formed thereon and forming a first copper metal layer over the substrate and comprising a plurality of copper contact pads. In addition, the method can comprise forming a plurality of resistive memory devices over a portion of surface area of the substrate and in contact with respective ones of a corresponding subset of the plurality of copper contact pads within the portion of the surface area, wherein the plurality of resistive memory devices are formed using two, three or four photo-resist mask layers and further wherein the plurality of resistive memory devices include respective ones of a set of first memory contact regions. Moreover, the method can comprise forming a second copper metal layer above the plurality of resistive memory devices and in electrical contact with the set of first memory contact regions.

In at least one additional embodiment, the disclosure provides a device including a resistive memory cell. The device can comprise a semiconductor substrate having a plurality of CMOS devices formed thereon, and having a plurality of exposed copper conductor contact regions. Additionally, the device can comprise a plurality of bottom electrodes above and in electrical contact with respective ones of at least a portion of the exposed copper conductor contact regions, within a blocking layer. Furthermore, the device can comprise a first dielectric layer disposed above the blocking layer and a resistive memory cell stack disposed within the first dielectric layer, above and in electrical contact with the plurality of bottom electrodes. The resistive memory cell stack can comprise a resistive switching material disposed above and in electrical contact with the plurality of bottom electrodes, and an active metal material disposed above and in electrical contact with the resistive switching material. In addition to the foregoing, the device can comprise an etch stop layer disposed within the first dielectric layer, above and in electrical contact with the active metal material; and a second dielectric layer disposed above the first dielectric layer, wherein the second dielectric layer includes a contact pad via exposing at least a portion of the etch stop layer. Still further, the device can comprise a copper metal disposed within the contact pad via, above and in electrical contact with the portion of the etch stop layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIGS. 2A and 2B illustrate block diagrams of example process for forming vias over a backend copper conductor, in another embodiment;

FIGS. 3A and 3B depict block diagrams of example processing for fabricating conductive electrodes for a two-terminal memory with a damascene process;

FIGS. 6A and 6B depict block diagrams of an example chemical mechanical polish (CMP) process and additional dielectric layer formation;

DETAILED DESCRIPTION

Figure 1:
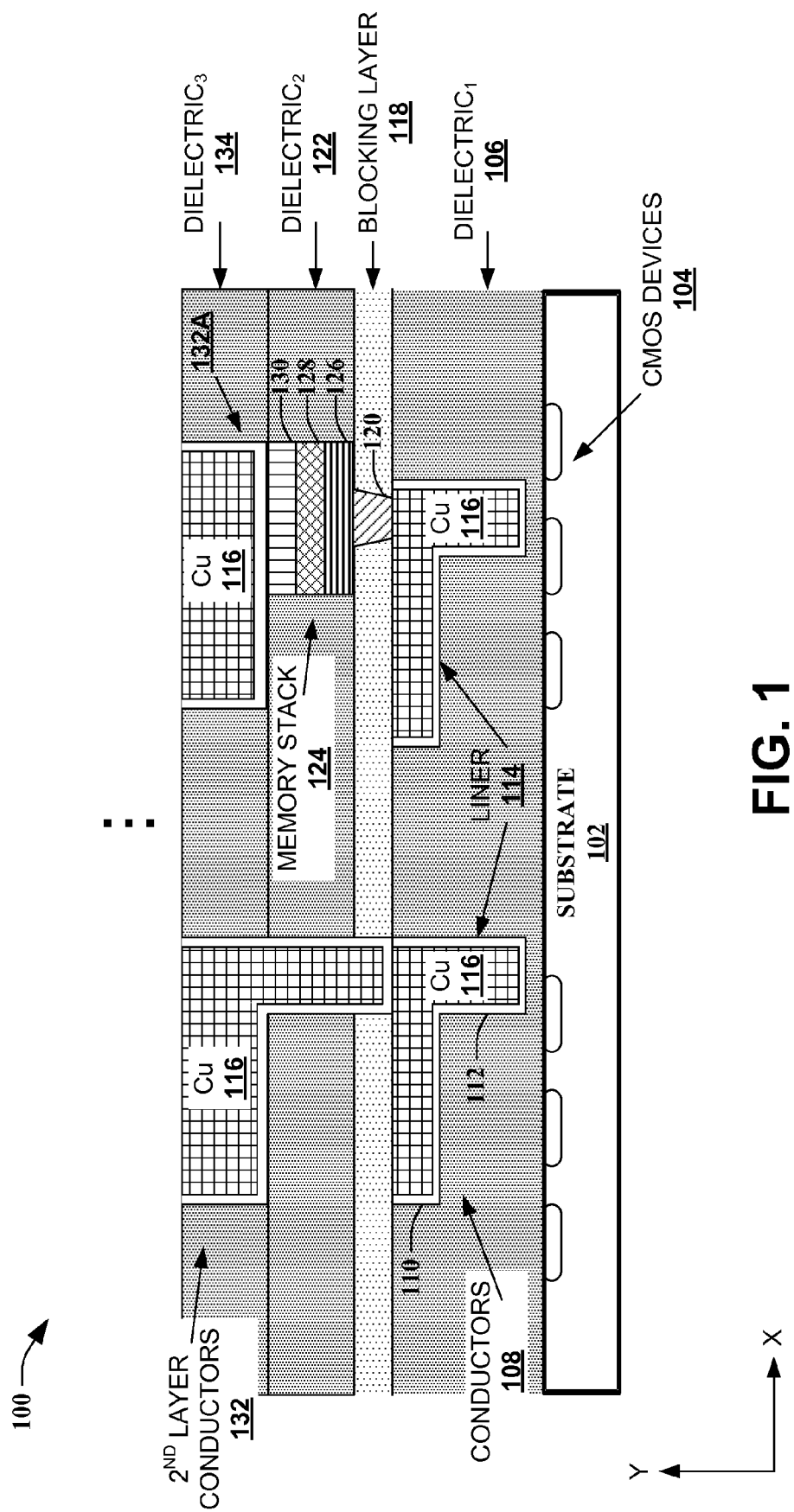
FIG. 1 depicts a block diagram of an example device with resistive memory embedded between copper backend layers, in disclosed embodiments.

Embodiments of the present disclosure provide for a memory device comprising one or more arrays of two-terminal memory fabricated between back-end-of-line metal layers of an electronic chip. In some embodiments, the BEoL metal layers can comprise copper metal layers. Back-end-of-line fabrication often refers to a secondary process of integrated circuit fabrication where electronic components (e.g., transistors, capacitors, resistors, etc.) formed in or on an integrated circuit substrate are connected to wiring layers of a wiring schematic for the integrated circuit. The wiring layers can be utilized to interconnect subsets of the electronic components, connect components to contact points, bonding sites for off-chip connections, or the like. The wiring layers can comprise horizontal lines, vertical interconnects, contact pads, and so on to facilitate the interconnection of components.

Copper backend metallization can impose significant restrictions on backend of line processes for integrated circuit manufacturing. These restrictions are due to multiple causes, including the physical nature of copper itself, materials it is compatible with and relatively low softening temperature. Copper tends to have relatively high diffusivity (e.g., mobility of atoms) and also reacts chemically with some common semiconductor materials. For instance, copper can detrimentally affect oxide materials often used for semiconductor gate insulators, dielectric layers, and so on. Accordingly, in some disclosed embodiments, copper metals can be lined with a diffusion mitigation material to mitigate or avoid diffusion of copper atoms throughout a device. Similarly, because copper tends to be chemically reactive, some materials that might be chemically compatible with aluminum or silver are not so compatible with copper. Furthermore, copper has a relatively low thermal budget, imposing a temperature ceiling on fabrication processes that follow the formation of copper.

One of the more unique challenges with copper metallization in terms of integrated circuit fabrication is the lack of subtractive etching techniques. Copper metal in a relatively pure state does not etch as cleanly as other metals such as aluminum, silver, titanium, etc. Accordingly, backend of line processes tend to utilize groove, fill and damascene techniques (e.g., planarization, chemical mechanical polish (CMP), and so forth) in conjunction with a copper metallization scheme. Though damascene processing adds its own complexities, it can often be less expensive than subtractive etching utilizing multiple photo-resists masks, as the latter can be quite expensive. Accordingly, the inventors have endeavored to develop backend-of-line integrated circuit fabrication processes with minimal photo-resist masks, to reduce fabrication cost. Furthermore, the inventors have endeavored to develop techniques that are compatible with copper backend metallization, for compatibility with existing integrated circuit foundries that employ copper on the backend, and to take advantage of the exceptional electrical properties of copper, as well as its low cost.

Historically, semiconductor memory had been fabricated on a memory chip having external connections to facilitate integration with other components, such as logic components, a processor(s), analog or digital circuitry, and so on. As integrated circuit fabrication processes advanced, merged memory-logic devices were developed having memory circuits and logic circuits together on a single die, or integrated chip. On-chip interconnect layers were utilized to electrically connect subsets of the logic circuits with other subsets of logic circuits, and with the memory circuits, consistent with a general electrical schematic layout for the memory logic device. In the context of semiconductor transistors, capacitors, resistors and like components, logic circuits and memory circuits constructed from these components are often fabricated in front-end-of line processes on different regions of a semiconductor substrate, and the metal lines, interconnects, contact pads, etc., were fabricated as backend-of-line processes.

The inventors of the present disclosure have recognized that some memory technologies are amenable to fabrication among backend structures. Examples include two-terminal memory devices formed with a monolithic stack of films or semiconductor layers. For instance, two-terminal memory devices suitable for backend integration can comprise resistive memory (e.g., resistive-switching memory, resistive random access memory, etc.), phase-change memory, conductive-bridging memory, and the like. Backend-integrated memory can facilitate reduction in die size for memory-logic chips. For instance, take the comparison of a semiconductor die having forty percent of its surface area allocated to front-end memory circuits and forty percent of its surface area allocated to front-end logic circuits (with the remaining twenty percent reserved for vertical vias, contact pads, and so on). By fabricating the memory circuits amid backend layers, the memory circuits can be positioned above (or partly above) the logic circuits on the semiconductor substrate, potentially reducing die size by up to forty percent. This concept requires memory that is compatible with backend layers, including material compatibility, process integration compatibility (e.g., what the memory—or layers thereof—can be exposed to, what can be etched or stopped on it, and so forth), and thermal compatibility. In addition, the memory must meet performance specifications (e.g., read/write times, meet target voltage specifications, etc.), maintain sufficient sensing margin (e.g., by mitigating leakage path currents) and at minimal costs.

Various embodiments of the present disclosure provide an integrated circuit device having memory fabricated among backend layers of the device. Further, the memory can be compatible with copper backend metallization, in some embodiments, and maintain schematic distances between backend layers, preserving inter-layer capacitance values provided by backend electrical models. Moreover, the memory can be constructed to mitigate leakage path currents, while minimizing additional costs to the backend fabrication process by utilizing no more than four photo-resist masks. In at least some embodiments, the memory can be constructed utilizing no more than two photo-resist masks (e.g., per two-dimensional layer of memory). Accordingly, the subject disclosure can provide a low cost, high performance two-terminal memory integrated into backend metal layers of an integrated circuit that maintains existing die sizes, preserves backend electrical models and is consistent with existing integrated circuit foundry fabrication protocols, even for relatively sensitive metallization schemes.

Referring now to the drawings, FIG. 1 depicts a block diagram of an example integrated circuit (IC)-device 100 according to one or more embodiments of the present disclosure. IC-device 100 can comprise a semiconductor substrate 102 comprising one or more CMOS devices 104 formed therein (or thereon). It should be appreciated that CMOS device 104 can include pMOS devices or nMOS devices, in some embodiments. CMOS devices 104 can comprise logic circuits, in some embodiments, including resistors, capacitors, inductors, transistors, clock source(s), power source(s), or other suitable component that can be manufactured on or within substrate 102, or suitable combinations of the foregoing. Above substrate 102 are one or more backend layers providing conductive contacts to electrically connect subsets of CMOS devices 104, or electrically connect components of IC-device 100 with external (e.g., off-chip) electrical contacts (not depicted).

The backend layers include dielectric layers and metal layers. In the embodiment depicted by FIG. 1, there is a first dielectric layer, dielectric$_1$ 106 above substrate 102. In some embodiments, dielectric$_1$ 106 can be selected to be a low-k or relatively low-k dielectric material. Conductors 108 (e.g., conductive lines extending in and out of the page) form contact pads 110 as well as vertical vias 112 (see also, e.g., FIGS. 7-10, infra) within dielectric$_1$ 106. Conductors 108 of IC-device 100 are filled with copper 116; however it should be appreciated that other suitable metallization schemes can be employed consistent with one or more embodiments of the present disclosure (in some cases, e.g., with variations in depicted embodiments that would be known to one of skill in the art, or made known by way of the context provided herein). Because copper has relatively high atomic diffusivity, and can degrade gate oxide materials, low-k dielectric materials, a diffusion mitigation liner 114 is provided between copper 116 and dielectric$_1$ 106. Diffusion mitigation liner 114 can be selected from suitable materials to mitigate or prevent copper atoms from migrating into dielectric$_1$ 106 from conductors 108, or through dielectric$_1$ 106 into gate oxides employed for CMOS devices 104, as one example. Diffusion mitigation liner 114 can comprise Ti, TiN, TaN, W, or another suitable conductive material suitable to mitigate or prevent diffusion of copper atoms, or a suitable combination of the foregoing.

Above dielectric$_1$ 106 and conductors 108 is a blocking layer 118. Blocking layer 118 can be in physical contact with copper 116 of conductors 108, in some embodiments. In other embodiments, one or more layers can be situated between copper 116 and blocking layer 118 (e.g., diffusion mitigation liner 114 can be provided between copper 116 and blocking layer 118 in at least one embodiment). Blocking layer 118 can be selected to mitigate or prevent diffusion of copper atoms from conductors 108 upward into additional backend layers of IC-device 100 over conductors 108. In addition to the foregoing, blocking layer 118 can comprise a set of conductive plugs 120 formed within blocking layer 118. Conductive plug(s) 120 can be formed in a subset of IC-device 100, in some embodiments. For instance, the set of conductive plugs 120 can be located within a subset (or multiple subsets) of an active area of IC-device 100, where the active area represents the usable surface area of substrate 102 on which CMOS devices 104 are (or can be) fabricated. Thus, as one example, the set of conductive plugs 120 can be positioned over a first subset(s) of the active area of IC-device 100, and vertical conductive interconnects (e.g., vertical via(s) 112) or other structures can be formed in a remainder of the active area. As depicted by FIG. 1, conductive plug(s) 120 is formed within blocking layer 118 on a right side of substrate 102 and a vertical via 112 of a second level of conductors 108 is formed on a left side of substrate 102 into or through blocking layer 118.

In some embodiments, conductive plug(s) 120 can be formed at least in part with a damascene process. For instance, a groove or via can be formed in blocking layer 118. Conductive material for conductive plug(s) 120 can be provided over blocking layer 118 and filling the groove or via. Blocking layer 118 and conductive plug(s) 120 can be planarized (e.g., via CMP process) to provide a smooth top surface for blocking layer 118 and conductive plug(s) 120. In one or more embodiments of the present disclosure, the groove or via in blocking layer 118 can be formed with a subtractive etch process. In at least one embodiment, the subtractive etch process can be implemented with a single photo-resist mask.

Above blocking layer 118 and conductive plug(s) 120 is a second dielectric layer, dielectric$_2$ 122. A stack of memory layers 124 can be formed over conductive plug(s) 120, with a bottom resistive switching layer 126 of stack of memory layers 124 in electrical contact with conductive plug(s) 120. Additionally, one or more layers of stack of memory layers 124 can have a lateral dimension (e.g., along an x-direction of FIG. 1, as shown at the lower left corner of the page), such as a width, diameter, etc., that is larger than a lateral dimension of conductive plug 120 at an interface of bottom resistive switching layer 126 and a top surface of conductive plug 120. Accordingly, stack of memory layers 124 (or at least bottom resistive switching layer 126) can cover the top surface of conductive plug 120.

In one or more embodiments, stack of memory layers 124 can comprise bottom resistive switching layer 126, a top electrode layer 128 and an additional conductor, such as a top conductive plug 130. In further embodiments, stack of memory layers 124 can be deposited as films and subtractively etched to form discrete two terminal memory structures. In an embodiment, stack of memory layers 124 can be etched with a single photo-resist mask (e.g., in addition to a first photo-resist mask utilized for the groove or via of conductive plug(s) 120, discussed above). Accordingly, in at least some disclosed embodiments, conductive plug(s) 120 and stack of memory layers 124 can provide a two-terminal memory device between conductive layers of IC-device 100 with two photo-resist masks.

As depicted by FIG. 1, a two-terminal memory device is formed by stack of memory layers 124 and conductive plug 120. For instance, conductive plug 120 can be a bottom electrode, bottom switching layer 126 can be a non-volatile memory retaining layer (e.g., storing one or more digital bits of information), top electrode layer 128 can serve as a second electrode for the two-terminal memory device, and top conductive plug 130 can have a selectable thickness to electrically connect top electrode layer 128 with a second layer conductor 132A above dielectric$_2$ 122. It should be appreciated that backend metallization schematics generally have tight control over inter-layer distances between metal layers. For instance, a distance between conductors 108 and a second layer of conductors 132, 132A affects capacitance of intervening dielectric layers. Even small changes to predetermined distances between backend metal layers can detrimentally affect backend capacitances, harming or even voiding electrical models of IC-device 100. Accordingly, by forming stack of memory layers 124 within a predetermined distance between conductors 108 and second layer of conductors 132, 132A, the distance and dielectric capacitances can be preserved. In some embodiments, stack of memory layers 124 can exclude top conductive plug 130; for instance when bottom resistive switching layer 126 and top electrode layer 128 can be formed at a combined thickness to electrically connect conductive plug(s) 120 and conductor 132A of second layer of conductors 132, 132A. In other embodiments, stack of memory layers 124 can include top conductive plug 130 with a thickness suitable to connect stack of memory layers 124 to conductor 132A.

Above dielectric$_2$ 122 and stack of memory layers 124 is a third dielectric layer, dielectric$_3$ 134. The second layer of conductors 132, 132A includes a set of conductors 132 respectively having a contact pad 110 and vertical via 112, and a modified set of conductors 132A respectively having a contact pad 110. Set of conductors 132 are formed over portions of IC-device 100 in which vertical vias 112 provide electrical connections to CMOS devices 104, and other devices, such as off-chip contact points, and so on. Modified set of conductors 132A include contact pads 110 connected to stack of memory layers 124. The modified set of conductors 132A can therefore facilitate operational control over the discrete two-terminal memory devices formed from stack of memory layers 124 and conductive plug(s) 120.

IC-device 100 can comprise additional dielectric and conductor layers above dielectric$_3$ 134 and second layer of conductors 132, 132A, in some embodiments. In some embodiments, one or more of the additional dielectric layers can comprise respective stacks of memory layers 124 and conductive plug(s) 120, yielding multiple two-dimensional arrays of discrete two-terminal memory devices within IC-device 100, providing higher density memory. In other embodiments, the additional dielectric layers can exclude the arrays of memory devices, and be utilized for interconnecting CMOS devices 104, or other suitable purposes for IC-device 100.

Referring to the disclosure more generally, various embodiments of the present disclosure provide memory devices that can comprise an array of non-volatile two-terminal memory. Examples of suitable two-terminal memory can include resistive memory, phase-change memory, conductive-bridging memory, magnetic memory, and so on. In one or more other embodiments, disclosed memory devices can comprise volatile memory, or a combination of volatile and non-volatile memory (e.g., a volatile selection device in electrical series with a non-volatile memory device).

Resistive memory, also referred to as resistive-switching memory cells or resistive-switching memory, as utilized herein, can comprise circuit components having conductive contacts with switching region between the conductive contacts. The switching region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

One embodiment of resistive memory is a resistive or conductive filamentary memory cell. By way of example, a filamentary-based memory cell can comprise: a conductive layer, e.g., metal, doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament forming ions to the RSL. When the conditions are removed, e.g. a voltage is removed, the ions become neutral metal particles, and become trapped within crystalline defects of the resistive switching layer. In various embodiments, the entrapped neutral metal particles help form a conductive filament (e.g., in response to an ionizing stimulus, such as a read voltage or other stimulus suitable to re-ionize the neutral metal particles) within the resistive switching layer.

In various embodiments of the present disclosure, a p-type or n-type Si bearing layer can include a p-type or n-type polysilicon, p-type or n-type SiGe, or the like. A RSL (which can also be referred to in the art as a resistive switching media (RSM)) can comprise, e.g., an amorphous Si layer, a semiconductor layer having intrinsic characteristics, a Si sub-oxide (e.g., SiOx wherein x has a value between 0.1 and 2), and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), $NbO_F$ (where F is a suitable positive number), and so forth, or a suitable combination thereof.

An active metal layer for a filamentary-based memory cell can include, among others: silver (Ag), gold (Au), nickel (Ni), copper (Cu), aluminum (Al), chromium (Cr), iron (Fe), manganese (Mn), vanadium (V), cobalt (Co), platinum (Pt), hafnium (Hf), palladium (Pd), or a suitable alloy of the foregoing. Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

FIGS. 2A and 2B illustrate block diagrams of IC-devices 200A, 200B in example respective stages of fabrication, according to one or more disclosed embodiments. IC-device 200A depicts a first dielectric, dielectric$_1$ 202A comprising a first layer of conductive contacts 204A. In some embodiments, conductive contacts 204A can be lined with a copper diffusion mitigation liner, and filled with copper metal, and dielectric₁ 202A can be a suitable electrical insulating material, such as an oxide, or other suitable dielectric. Over dielectric₁ 202A and conductive contacts 204A is a blocking layer 206A. Blocking layer 206A can comprise an electrical conductor that mitigates or prevents diffusion of copper atoms within or through blocking layer 206A. Examples of blocking layer 206A can comprise Ti, TiN, TaN, W, SiN, SiC, SiCN, or other suitable conductive, copper diffusion mitigation layer, or a suitable combination of the foregoing. Over blocking layer 206A, a photo-resist mask 208A is provided, having resist gaps 210A positioned at target locations for bottom electrodes of an array of two-terminal memory devices.

At FIG. 2B, IC-device 200B is depicted after subtractive etching of blocking layer 202B, and removal of photo-resist mask 208A (e.g., by planarization, CMP, or the like). The subtractive etching forms a set of via structures 204B, or grooves, within blocking layer 206A. In various embodiments, via structures 204B can be etched through blocking layer 206A to expose copper metal 202B at a top surface of respective conductive contacts 204A.

Referring to FIGS. 3A and 3B, there are depicted block diagrams of IC-devices 300A, 300B in example respective stages of fabrication, according to further embodiments. IC-device 300A comprises a conductive fill 302A provided over blocking layer 306A and within via structures (e.g., via structures 204B of FIG. 2B, supra) formed within blocking layer 306A, to form filled via structures 304A. Conductive fill 302A can be a doped semiconductor material, such as Si, polysilicon, polycrystalline Si, doped SiGe, Ti, TiN, TaN, W, Pt, Cu, or the like, a suitable metal or metal alloy, and so forth. In addition, it should be appreciated that conductive fill 302A can extend within filled via structures 304A to a conductive boundary 308A with contacts 310A. Accordingly, contacts 310A are respectively in electrical contact with respective ones of filled via structures 304A.

At FIG. 3B, conductive fill 302A is removed from a top surface of blocking layer 304B and filled via structures 304A. Removal can be via planarization, CMP, or the like. Filled via structures 304A form bottom electrode structures 302B following the removal of conductive fill 302A from above the top surface of blocking layer 304B and filled via structures 304A. Because filled via structures 304A comprised conductive fill 302A in electrical contact with contacts 310A, bottom electrode structures 302B formed within blocking layer 306A are likewise in electrical contact with a bottom electrode-copper boundary 304B of contacts 310A and bottom electrode structures 302B. It should be appreciated that in at least some embodiments, an intermediate layer can be provided between copper metal of contacts 310A and bottom electrode structures 302B, so that bottom electrode-copper boundary 304B will be in electrical contact if not immediate physical contact.

Figure 4A:
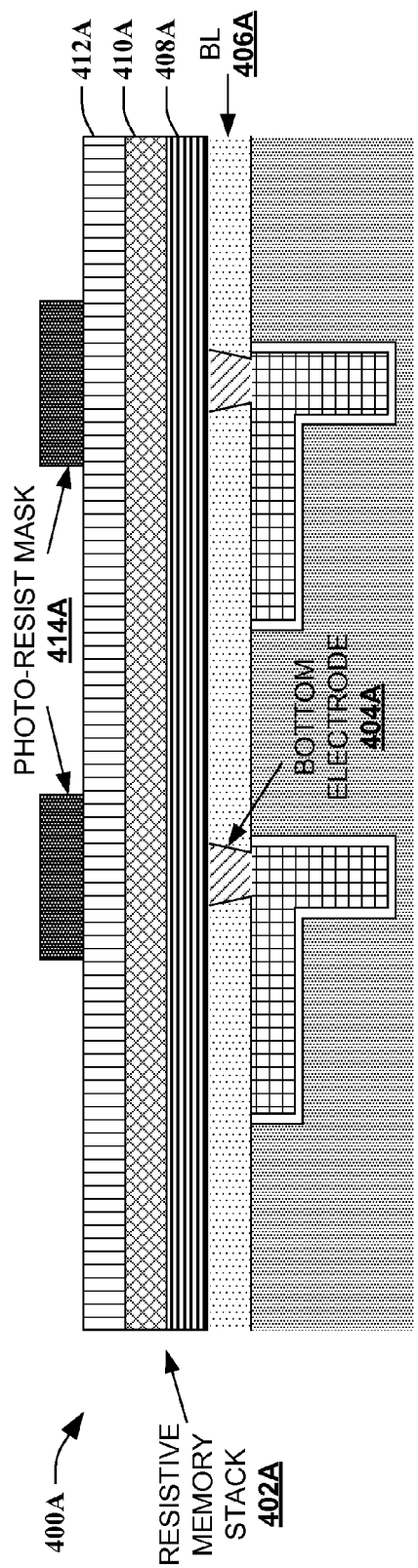
FIGS. 4A and 4B illustrate block diagrams of example processing for fabricating discrete memory structures over the conductive electrodes, in an embodiment.
Figure 4B:
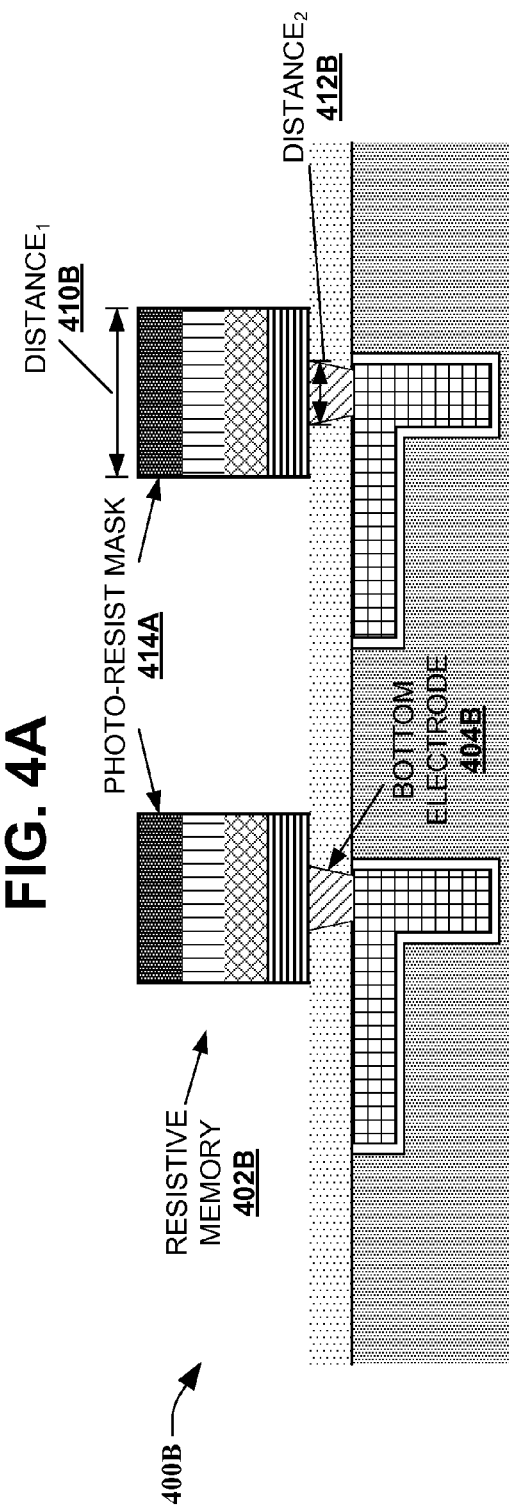

FIGS. 4A and 4B depict block diagrams of IC-devices 400A, 400B illustrating further example fabrications steps according to one or more further embodiments. IC-device 400A comprises a blocking layer 406A having a set of bottom electrodes 404A in contact with respective metal contacts of IC-device 400A. Additionally, a resistive memory stack 402A is provided over blocking layer 406A and bottom electrodes 404A. In various embodiments, resistive memory stack 402A can comprise a resistive switching layer 408A. Resistive switching layer 408A can comprise an undoped amorphous silicon, a non-crystalline silicon, a non-stoichiometric silicon oxide, (e.g., $SiO_x$, where $0<x<2$), or the like, or a suitable combination of the foregoing. In at least one embodiment, resistive memory stack 402A can comprise a barrier material layer 412A. Barrier material layer 412A can be Ti, TiN, TaN, W, or the like, or other suitable diffusion mitigation layer. Additionally, resistive memory stack 402A can comprise a layer of active metal material 410A. Active metal material 410A can comprise a source for metallic particles, such as Ag, Cu, Al, Au, Ti, Pt or Pd metal or alloy, an etchable copper alloy, or the like, or suitable combinations of the foregoing. In at least one embodiment, active metal material 410A and barrier material layer 412A can be switched in their respective positions.

In one or more embodiments, resistive memory stack 402A can additionally comprise one or more selection layers forming a selection device in electrical series with a two-terminal memory device formed by resistive memory stack 402A. The selection layer(s) can be formed between bottom electrodes 404A and resistive switching layer 408A in one embodiment. In another embodiment, the selection layer(s) can be formed above active metal material 410A. The selection layers can comprise a volatile switching layer, configured to have a first state (e.g., high resistance) in response to an activation stimulus, and a second state (e.g., low resistance, etc.) in absence of the activation stimulus. The volatile switching layer can be a filamentary device comprising an electrically resistive material having relatively few defect sites (e.g., particle-trapping locations) that would prevent diffusion of ions throughout the volatile switching layer. In response to the activation stimulus, ions can migrate into the volatile switching layer forming a conductive filament(s) therein. In the absence of the activation stimulus, and at least in part because of the relatively few defect sites, the conductive filament can deform (e.g., ions can become neutral atoms or diffuse through the volatile switching layer, or the like). In various embodiments, the volatile switching layer can comprise Cu, Al, Ti, W, Ag, Ni, a solid electrolyte, a silicon sub-oxide (e.g., $SiO_x$, $0<x<2$), $Al_2O_3$, $HfO_3$, ZnO, or the like, or a suitable combination thereof. In other embodiments, the volatile switching layer can be a non-stoichiometric material, such as a non-stoichiometric metal-oxide or metal-nitride. Examples of these embodiments can include $TiO_x$, $AlO_x$, $WO_x$, $Ti_xN_yO_z$, or the like, or a suitable combination thereof, where x, y and z are suitable non-stoichiometric values. In at least one embodiment, the volatile switching layer can be doped with a metal(s) during fabrication, to achieve a target resistance or conductance characteristics.

In addition to the foregoing, the selection layers can additionally comprise one or more selection electrodes. A first selection electrode can be placed on one side of the volatile switching layer (e.g., a top surface), and a second selection electrode can be placed on a second side of the volatile switching layer (e.g., a bottom surface). In some embodiments, active metal layer 410A can serve as the first or second selection electrode. In other embodiments, a copper conductor (e.g., second layer conductor 132A of FIG. 1, supra) of IC-device 400A can serve as the first or second selection electrode. In other embodiments, the first selection electrode or the second selection electrode can be provided separate from (e.g., in addition to) active metal layer 410A or the copper conductor. In one or more embodiments, the selector device can be a Crossbar FAST™ device. In further embodiments, the selector device can comprise one or more ion conductor layers between the volatile switching layer and the first selection electrode or the second selection electrode. For instance, in one embodiment, a first ion conductor layer can be provided between first selection electrode and volatile switching layer, and a second ion conductor layer can be provided between second selection electrode and volatile switching layer. Ion conductor layers can comprise a solid electrolyte (e.g., Ag—Ge—S, Cu—Ge—S, Ag—Ge—Te, Cu—Ge—Te, etc.), a metal-oxide alloy (e.g., AgSiO$_2$, etc.), or the like.

IC-device 400A can additionally comprise a photo-resist mask 414A placed over resistive memory stack 402A. Photo-resist mask 414A can cover portions of resistive memory stack 402A to be formed by subtractive etching into discrete two-terminal memory devices. Where the selection layers are provided for IC-device 400A, an additional mask and etching process can be utilized (e.g., following etching and removal of photo-resist mask 414A), where suitable, to form the selection device.

Referring to FIG. 4B, IC-device 400B illustrates discrete two-terminal resistive memory structures 402B formed after the subtractive etching around photo-resist mask 414A. Discrete two-terminal resistive memory structures 402B can comprise respective etched layers of resistive memory stack 402A and respective bottom electrodes 404B. Note that in some embodiments, discrete resistive memory devices 402B can have a portion having a first lateral dimension 410B that is wider than a second lateral dimension of a second portion of discrete resistive memory devices 402B. For example, etched portions of resistive memory stack 402A can have a lateral dimension (e.g., width, diameter, etc.) of a first distance, distance$_1$ 410B, and bottom electrode 404B can have a lateral dimension of a second distance, distance$_2$ 412B. In various embodiments, distance$_1$ 410B can be larger in value than distance$_2$ 412B. However, in an alternative embodiment, distance$_2$ 412B can be equal to or larger than distance$_1$ 410B.

Figure 5:
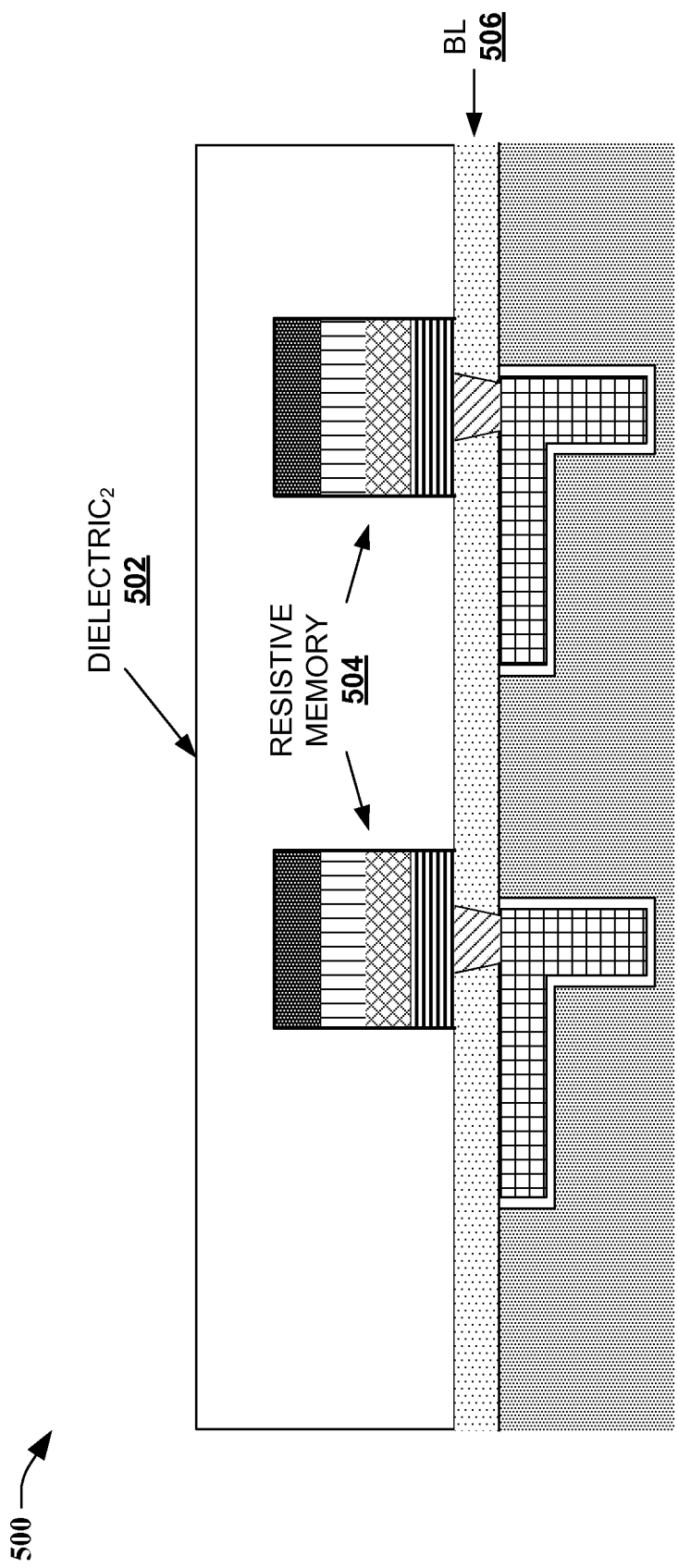
FIG. 5 illustrates a block diagram of an example dielectric layer for backend processing over discrete memory structures, in further embodiments.

FIG. 5 depicts a block diagram of an example IC-device 500 having discrete memory structures formed over conductive copper contacts. A second dielectric layer, dielectric$_2$ 502 is provided over a blocking layer 506 and over a set of discrete resistive memory structures 504. Delectric$_2$ 502 can be a relatively low-k dielectric, in various embodiments.

FIGS. 6A and 6B illustrate block diagrams of example IC-devices 600A, 600B related to fabrication of two-terminal memory in backend layers of IC-devices 600A, 600B. IC-device 600A can comprise a second dielectric, dielectric$_2$ 602A over a blocking layer 608A and a set of discrete resistive memory structures 606A. Dielectric$_2$ 602A can be planarized (e.g., with a CMP) with a top surface of discrete resistive memory structures 606A. Planarization of dielectric$_2$ 602A and discrete resistive memory structures 606A can remove a photo-resist mask (e.g., photo-resist mask 414A) remaining on discrete resistive memory structures 606A, in some embodiments. In further embodiments, the top surface of discrete resistive memory structures 606A following the planarization of dielectric$_2$ 602A can be an etch stop layer 604A. Accordingly, a top surface of dielectric$_2$ 604A is flush with top surfaces of the set of discrete resistive memory structures 606A.

IC-device 600B comprises a third dielectric layer, dielectric$_3$ 602B. Dielectric$_3$ 602B can be formed over the planarized surface of dielectric$_2$ 602A and discrete resistive memory structures 606A. Dielectric$_3$ 602B can be a low-k dielectric, in one or more embodiments.

Figure 7:
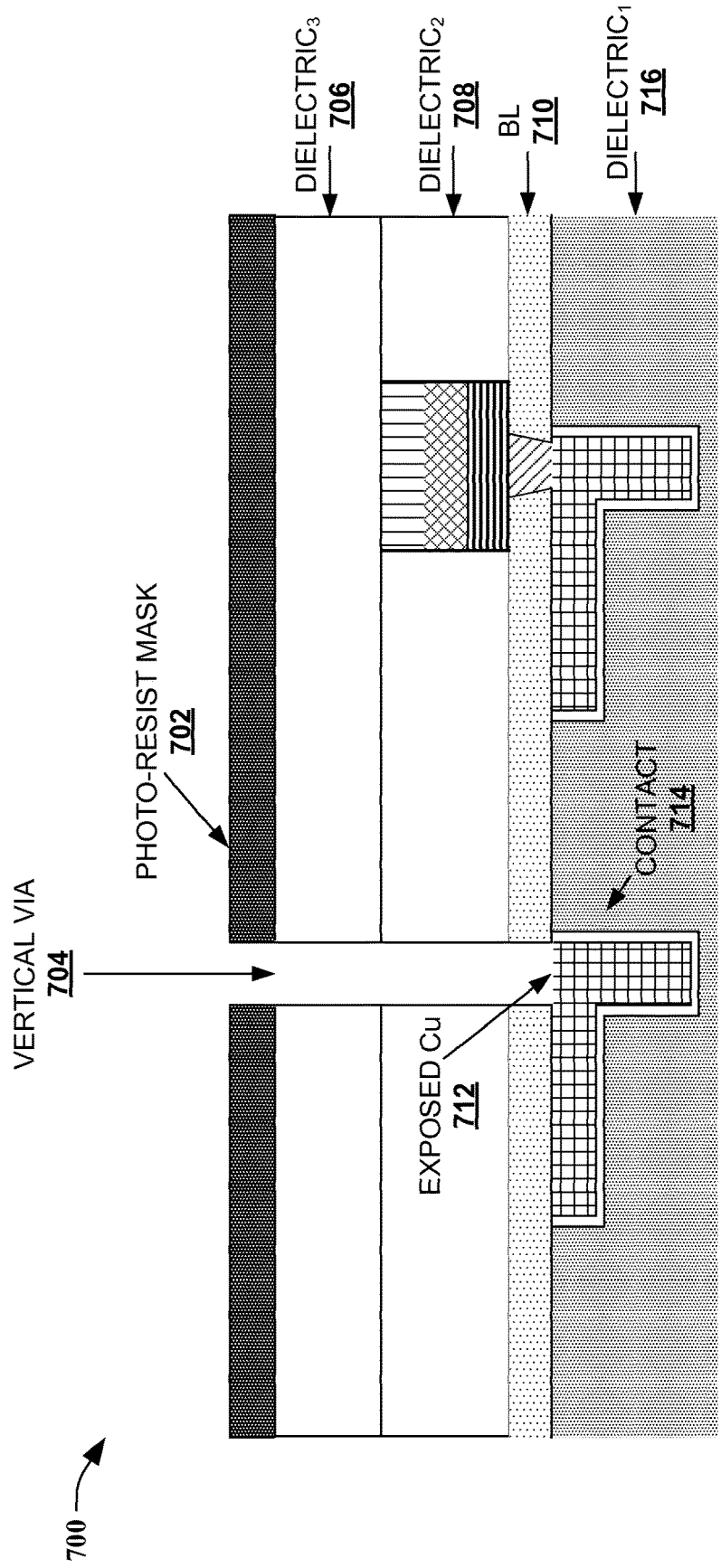
FIG. 7 depicts a block diagram of a sample subtractive etch process for forming a vertical via in a region of the device away from embedded memory

FIG. 7 depicts a block diagram of an IC-device 700 related to fabrication of backend memory structures, according to one or more additional embodiments of the present disclosure. IC-device 700 illustrates an area of IC-device 700 including memory structures (e.g., on a right side of a second layer dielectric, dielectric$_2$ 708) and a second area excluding memory structures (e.g., on a left side of dielectric$_2$ 708). IC-device 700 comprises a first dielectric layer, dielectric$_1$ 716 having a first set of conductive contacts 714. Over dielectric$_1$ 716 and first set of conductive contacts 714 is a blocking layer 710, and second dielectric layer, dielectric$_2$ 708 over blocking layer 710. A third dielectric layer, dielectric$_3$ 706 has a photo-resist mask 702 formed thereon, with a gap in the photo-resist mask 702 through which a vertical via 704 can be etched. Vertical via 704 can extend down through dielectric$_3$ 706, through dielectric$_2$ 708 and blocking layer 710 to one of contacts 714 in the second area of IC-device 700 (on the left side of dielectric$_2$ 708, without the memory structures). In at least some embodiments, vertical via 704 can expose a conductive surface (e.g., copper surface) of contact 714.

Figure 8:
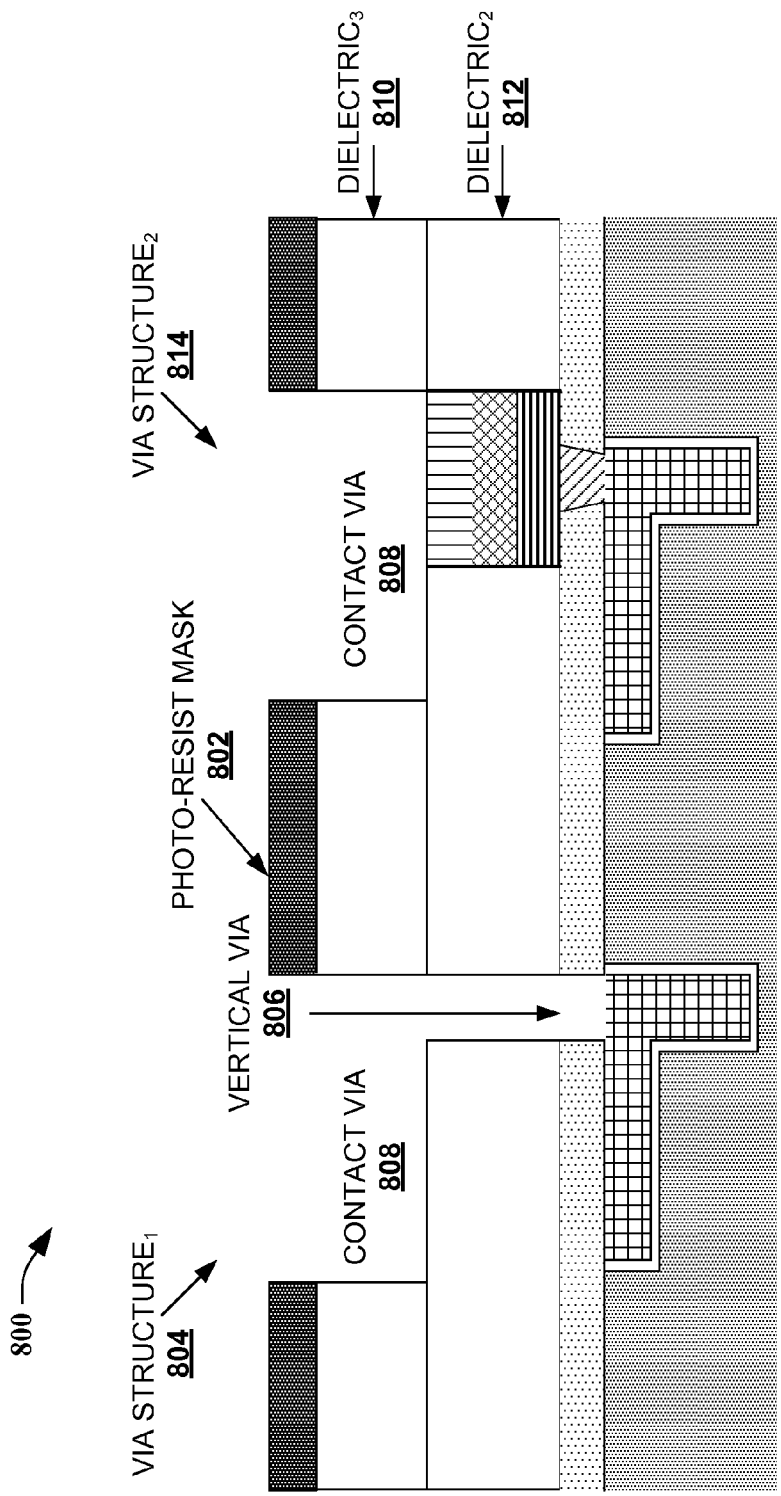
FIG. 8 illustrates a block diagram of an example subtractive etch process for forming a contact via adjacent to the vertical via in one or more embodiments.

FIG. 8 depicts a block diagram of an IC-device 800 according to further embodiments of the present disclosure. IC-device 800 comprises a set of via structures, including a first set of via structures, via structures$_1$ 804, and a second set of via structures, via structures$_2$ 814. Via structures$_1$ 804 and via structures$_2$ 814 are in part formed by subtractive etching around a photo-resist mask 802. The subtractive etching removes material from a third dielectric layer of IC-device 800, dielectric$_3$ 810, forming contact vias 808 within via structures$_1$ 804 and via structures$_2$ 814. Via structures$_1$ 804 comprise a contact via 808 adjacent and contiguous with a vertical via 806. In various embodiments, contact via 808 and vertical via 806 of via structures$_1$ 804 can be formed in separate subtractive etch processes (e.g., see FIG. 7, supra for fabrication of vertical via 806). In at least one embodiment, contact via 808 and vertical via 806 can be formed with a single photo-resist mask 802 and consecutive subtractive etch processes. Contact via 808 of via structures$_1$ 804 can extend through dielectric$_3$ 810 to a surface of a lower dielectric layer, dielectric$_2$ 812, exposing dielectric$_2$ 812 in some embodiments, and not exposing dielectric$_2$ 812 in an alternative embodiment. Vertical via 806 extends through dielectric$_3$ 810 and dielectric$_2$ 812 and a blocking layer to expose a lower conductive contact. Contact via 808 of via structures$_2$ 814 are formed through dielectric$_3$ 810 and expose respective top surfaces of memory devices formed beneath via structures$_2$ 814.

Figure 9:
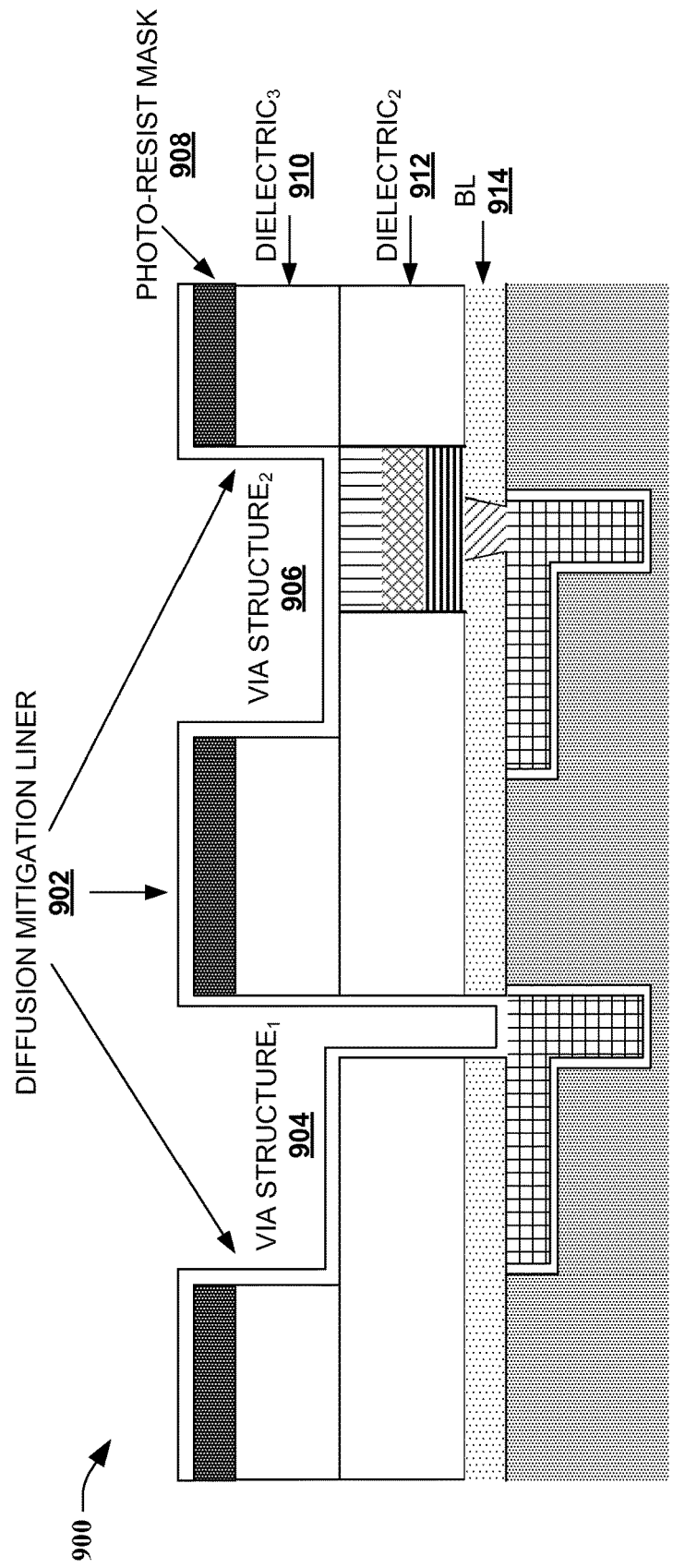
FIG. 9 illustrates a block diagram of a sample diffusion mitigation liner deposition over via regions, in one or more embodiments.

FIG. 9 illustrates a block diagram of an IC-device 900 according to additional embodiments of the subject disclosure. IC-device 900 can comprise a diffusion mitigation liner 902 formed over via structures, including via structures$_1$ 904 and via structures$_2$ 906, within an upper dielectric layer, dielectric$_3$ 910 of IC-device 900. In some embodiments, diffusion mitigation liner 902 can be formed over a photo-resist mask 908 utilized for formation of via structures$_1$ 904 or via structures$_2$ 906. In other embodiments, photo-resist mask 908 can be removed prior to provision of diffusion mitigation layer 902. In various embodiments, diffusion mitigation layer 902 can comprise Ti, TiN, TaN, W, or the like, or a suitable combination thereof. With respect to via structures$_1$ 904, diffusion mitigation liner 902 can extend along a vertical via portion (e.g., see vertical via 806 of FIG. 8, supra) of via structures$_1$ 904 into a second dielectric, dielectric$_2$ 912, a blocking layer 914 beneath dielectric$_2$ 912, and to an exposed conductive contact (e.g., copper, etc.) below blocking layer 914. Within via structures$_2$ 906, diffusion mitigation liner 902 is in contact with a surface of dielectric$_3$ 910 formed by via structures$_2$ 906, and in contact with a top surface of a memory structure formed within dielectric$_2$ 912.

Figure 10:
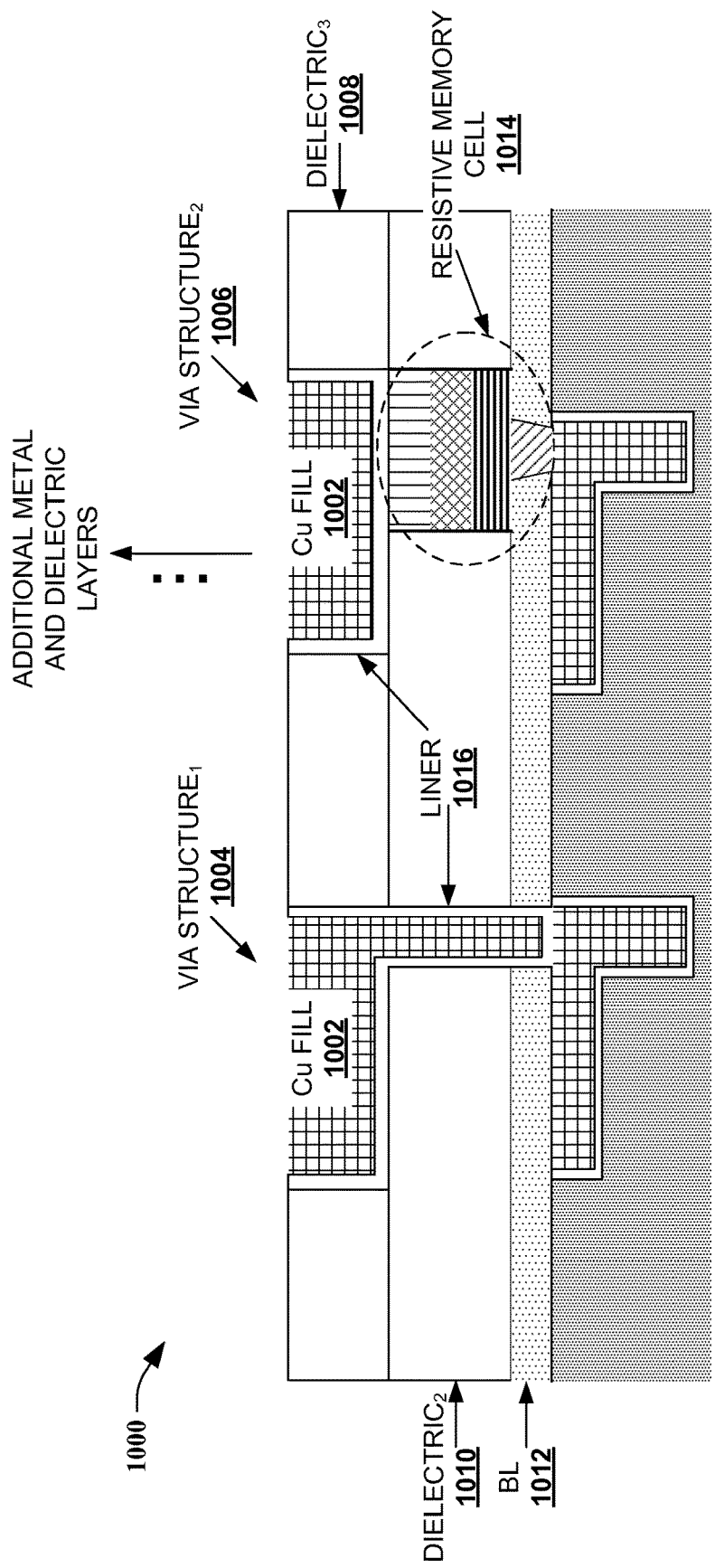
FIG. 10 depicts a block diagram of an example copper fill process to form a metal layer above embedded resistive memory, in a further embodiment.

FIG. 10 depicts a block diagram of an IC-device 1000 according to still further embodiments of the present disclosure. IC-device 1000 comprises a copper metal fill 1002 formed within a first set of via structures$_1$ 1004 and a second set of via structures$_2$ 1006 within an upper dielectric layer of IC-device 1000, dielectric$_3$ 1008. Copper metal fill 1002 in via structures$_1$ 1004 and via structures$_2$ 1006 is contained within a liner 1016 selected to mitigate or prevent diffusion of copper particles through liner 1016. Accordingly, liner 1016 can protect materials within IC-device 1000 from exposure to copper particles, by mitigating or avoiding migration of copper metal outside of via structures$_1$ 1004 and via structures$_2$ 1006, respectively. Copper metal fill 1002 within via structures$_1$ 1004 can extend within a vertical via portion of via structures$_1$ 1004, through dielectric$_3$ 1008, a second dielectric layer, dielectric$_2$ 1010 and a blocking layer 1012, and provide electrical connectivity to a lower conductive contact of IC-device 1000. Copper metal fill 1002 within via structures$_2$ 1006 facilitates electrical contact for a resistive memory cell 1014 formed within dielectric$_2$ 1010 and blocking layer 1012. A first (e.g., top) terminal of resistive memory cell 1014 can be in electrical contact with one of via structures$_2$ 1006, and a second (e.g., bottom) terminal of resistive memory cell 1014 formed within blocking layer 1012 can be in electrical contact with a lower conductive contact, as depicted. By controlling electrical signals at the via structure$_2$ 1006 and lower conductive contact, resistive memory cell 1014 can be operated as a two-terminal memory device for suitable memory operations (e.g., read, program, erase, etc.), by providing a suitable electrical stimulus at the first terminal and second terminal of resistive memory cell 1014.

In various embodiments, IC-device 1000 can comprise one or more additional dielectric/metal contact layers formed above dielectric$_3$ 1008 and via structures$_1$ 1004 and via structures$_2$ 1006. Such dielectric/metal layers can be formed similar to formation of blocking layer 1012, dielectric$_2$ 1010, dielectric$_3$ 1008 and via structures 1004, 1006, as described herein. In some embodiments, a subset of the one or more additional dielectric/metal layers can comprise additional resistive memory cells 1014, formed above dielectric$_3$ 1008, in a manner analogous to that described elsewhere herein. Accordingly, IC-device 1000 can comprise an array(s) of two-dimensional memory cells 1014 on a single backend layer, or multiple arrays on multiple backend layers, as suitable.

The aforementioned diagrams have been described with respect to interaction between several components of a memory device, including CMOS devices, conductive interconnects, memory cells, and the like, or components or layers of a memory cell. It should be appreciated that in some suitable alternative aspects of the subject disclosure, such diagrams can include those components, devices, layers, etc., specified therein, some of the specified components/devices/layers, or additional components/devices/layers. Sub-components can also be implemented as connected to other sub-components rather than included within a parent component. For example, functionality of a single semiconductor film can be provided with separate films, where suitable. Additionally, it is noted that one or more disclosed processes can be combined into a single process providing aggregate functionality. Components of the disclosed devices/layers can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 6-13. While for purposes of simplicity of explanation, the methods of FIGS. 6-13 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 11:
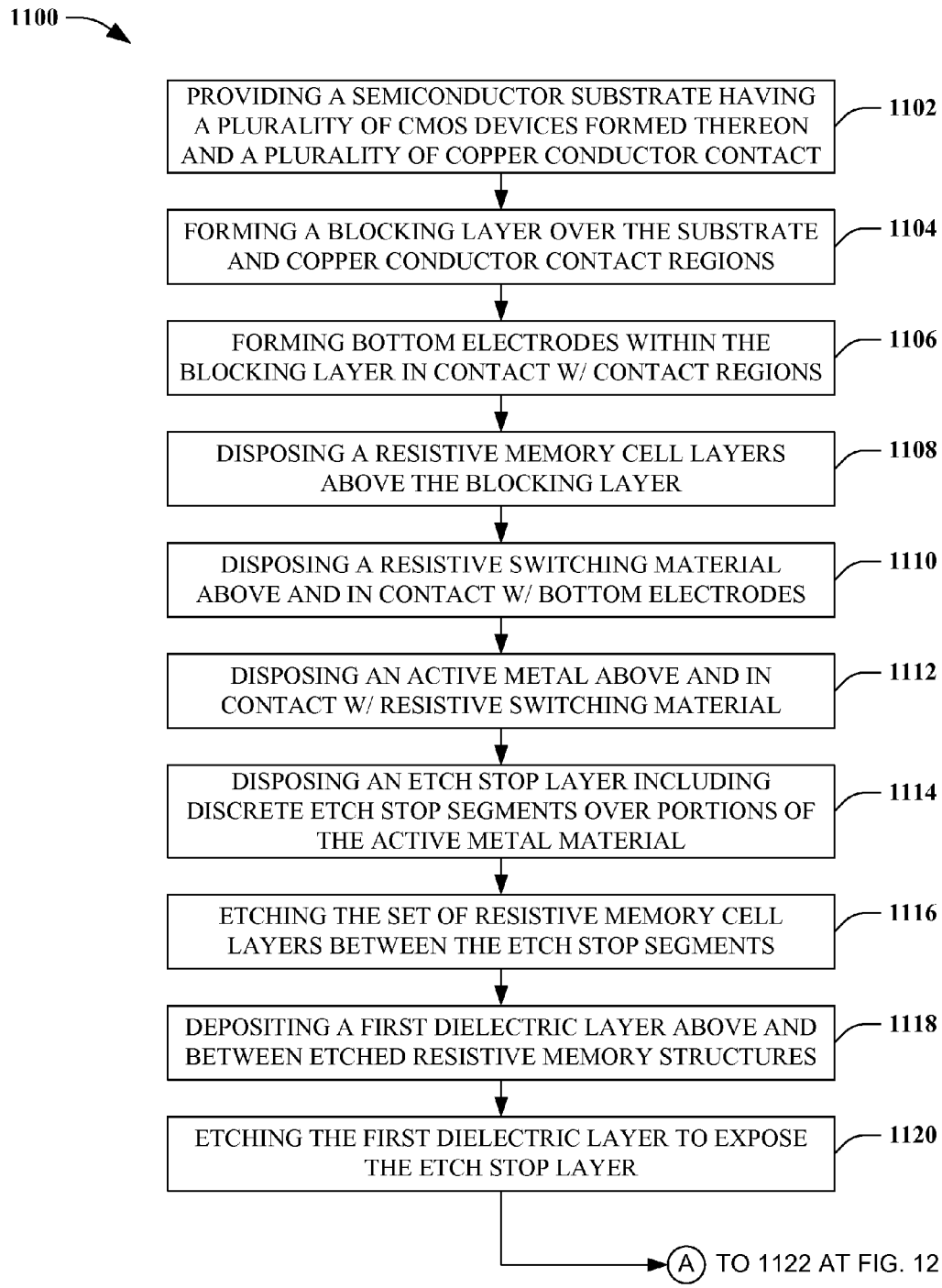
FIGS. 11 and 12 illustrate a flowchart of an example method for fabricating embedded memory according to one or more disclosed embodiments.
Figure 12:
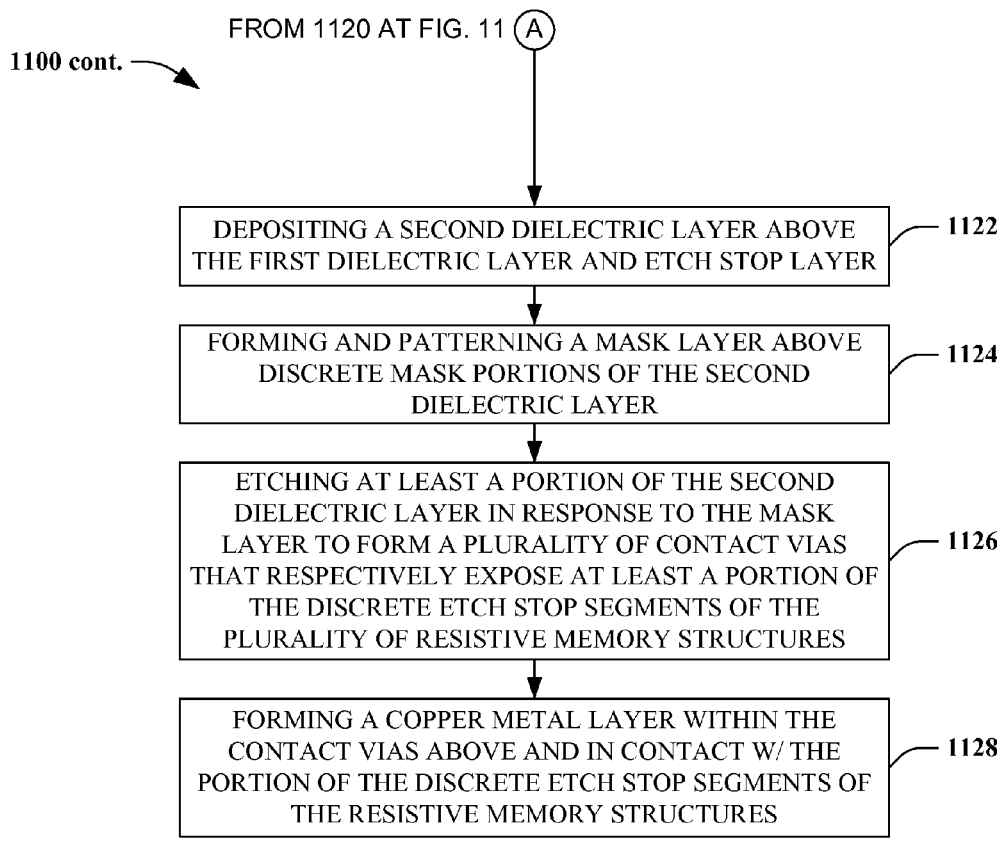

FIGS. 11 and 12 illustrate a flowchart of an example method 1100 for fabricating memory within backend layers of an integrated circuit, according to one or more additional embodiments of the present disclosure. At 1102, method 1100 can comprise providing a semiconductor substrate having a plurality of CMOS devices formed thereon and a plurality of copper conductor contacts. At 1104, method 1100 can comprise forming a blocking layer over the substrate and copper conductor contact regions. The blocking layer can be selected from Ti, TiN, TaN, W, or the like, or a suitable combination thereof. At 1106, method 1100 can comprise forming bottom electrodes within the blocking layer in contact with contact regions. In various embodiments, forming the bottom electrodes can further comprise forming a via or groove within the blocking layer (e.g., using a subtractive etch and a photo-resist mask), filling the via or groove with conductive material, and planarizing a top surface of the blocking layer and filled via/groove. At 1108, method 1100 can comprise disposing a stack of resistive memory films above the blocking layer. Disposing the stack of resistive memory films can further comprise, at 1110, depositing a resistive switching layer over the blocking layer and bottom electrodes, and at 1112, depositing an active metal layer over the resistive switching layer, and at 1114, depositing an etch stop layer including discrete etch stop segments over portions of the active metal material layer. In some embodiments, a second blocking layer can be provided with the stack of resistive memory films, deposited below, above or between one or more of the resistive switching layer, active metal layer or etch stop layer, as suitable.

At 1116, method 1100 can comprise etching a set of resistive memory cell layers between the discrete etch stop segments. At 1118, method 1100 can comprise depositing a first dielectric layer above and between etched resistive memory structures. At 1120, method 1100 can comprise etching the first dielectric layer to expose the etch stop layer. From 1120, method 1100 continues at 1122 of FIG. 12. At 1122, method 1100 can comprise depositing a second dielectric layer above the first dielectric layer and etch stop layer. At 1124, method 1100 can comprise forming and patterning a mask layer above discrete mask portions of the second dielectric layer. At 1126, method 1100 can comprise etching at least a portion of the second dielectric layer in response to the mask layer to form a plurality of contact vias that respectively expose at least a portion of the discrete etch stop segments of the plurality of resistive memory structures. At 1128, method 1100 can comprise forming a copper metal layer within the contact vias above and in contact with the portion of the discrete etch stop segments of the resistive memory structures.

Figure 13:
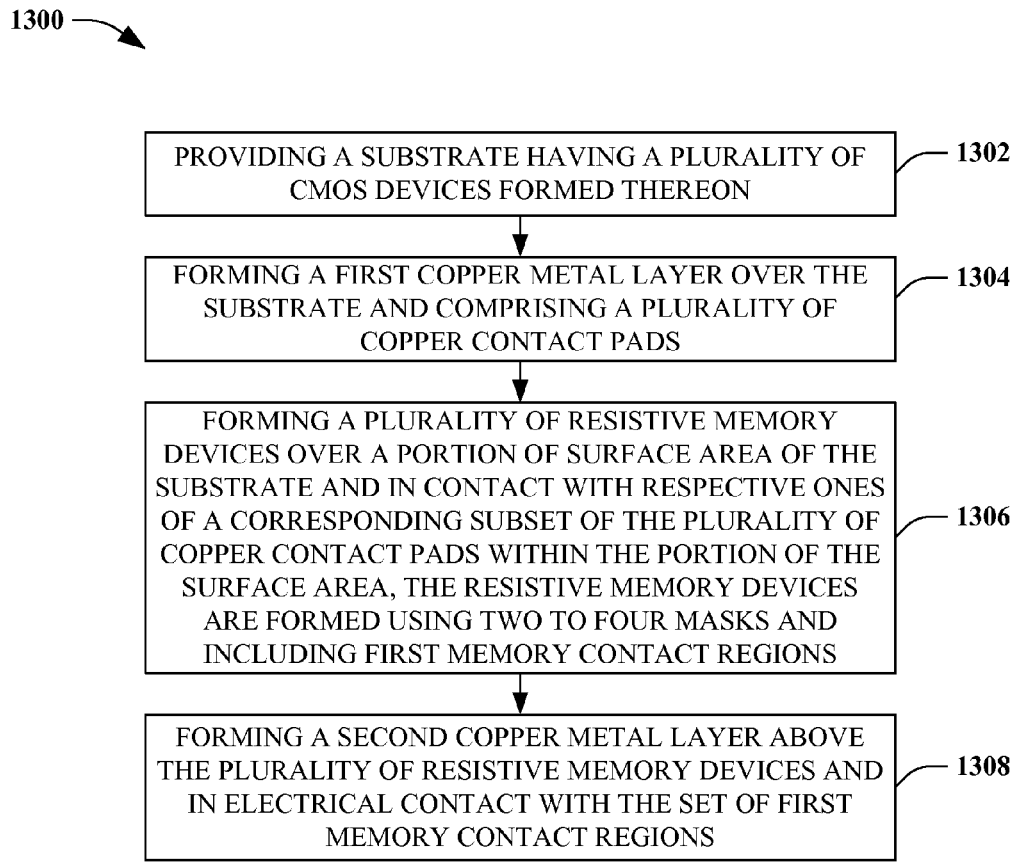
FIG. 13 depicts a flowchart of a sample method for fabricating a memory device having embedded memory, in further embodiments.

FIG. 13 depicts a flowchart of a sample method 1300 for forming a memory among backend copper wiring layers of an integrated circuit according to additional embodiments of the present disclosure. At 1302, method 1300 can comprise providing a substrate having a plurality of CMOS devices formed thereon, and having a plurality of exposed copper conductor contact regions. At 1304, method 1300 can comprise forming a blocking layer over the semiconductor substrate and copper conductor contact regions. Additionally, at 1306, method 1300 can comprise forming a plurality of resistive memory devices over a portion of surface area of the substrate and in contact with respective ones of a corresponding subset of the plurality of copper contact pads within the portion of the surface area, wherein the plurality of resistive memory devices are formed using two, three or fourth photo-resist mask layers and further wherein the plurality of resistive memory devices include respective ones of a set of first memory contact regions. Moreover, at 1308, method 1300 can comprise forming a second copper metal layer above the plurality of resistive memory devices and in electrical contact with the set of first memory contact regions.

In one or more additional embodiments, forming the plurality of resistive memory devices of method 1300 can further comprise forming a copper diffusion mitigation layer over the first copper metal layer. Additionally, method 1300 can comprise forming a set of bottom electrodes within discrete voids of the copper diffusion mitigation layer utilizing an etch, fill and polish process (e.g., CMP, etc.), wherein forming the discrete voids within the copper diffusion mitigation layer utilizes a first photo-resist mask layer of the two, three or four photo-resist mask layers that forms the discrete voids respective having a first lateral dimension. Further, method 1300 can comprise forming a stack of resistive memory films over the planarized diffusion mitigation layer and set of bottom electrodes, and depositing an etch stop layer over discrete subsets of the stack of resistive memory films, wherein the discrete subsets respectively have a second lateral dimension larger than the first lateral dimension and cover respective ones of the set of bottom electrodes. In addition to the foregoing, method 1300 can comprise forming a second photo-resist mask layer of the two, three or four photo-resist mask layers over the discrete subsets of the stack of resistive memory films, and etching the plurality of resistive memory devices from the discrete subsets of the stack of resistive memory films.

According to alternative or additional embodiments, forming the plurality of resistive memory devices of method 1300 can comprise forming a second plurality of memory contact regions using a first new mask layer, wherein the second plurality of memory contact regions are in contact with the plurality of copper contact pads, and disposing a resistive switching material layer above and in contact with the second plurality of memory contact regions. Moreover, method 1300 can comprise disposing an active metal material layer above the resistive switching material layer, disposing an etch stop material layer above the active metal material layer, and forming the plurality of resistive memory devices using a second new mask layer to form a resistive memory stack comprising the resistive switching material layer, the active metal material layer, and the etch stop material layer.

In one or more other embodiments of method 1300, the plurality of resistive memory devices are formed with exactly two photo-resist mask layers. In another embodiment, the second plurality of memory contact regions comprises a conductive polycrystalline silicon-containing material. In a further embodiment, a resistive switching material employed for the plurality of resistive memory devices can be selected from a group consisting of: undoped amorphous silicon, non-crystalline silicon, non-stoichiometric silicon oxide (e.g., $SiO_x$, $0<x<2$), silicon germanium, doped silicon germanium, and so forth. In yet another embodiment, an active metal material employed for the plurality of resistive memory devices can comprise silver, aluminum, gold, copper, an etchable copper alloy, platinum, palladium, titanium, or the like, or a suitable combination of the foregoing.

Figure 14:
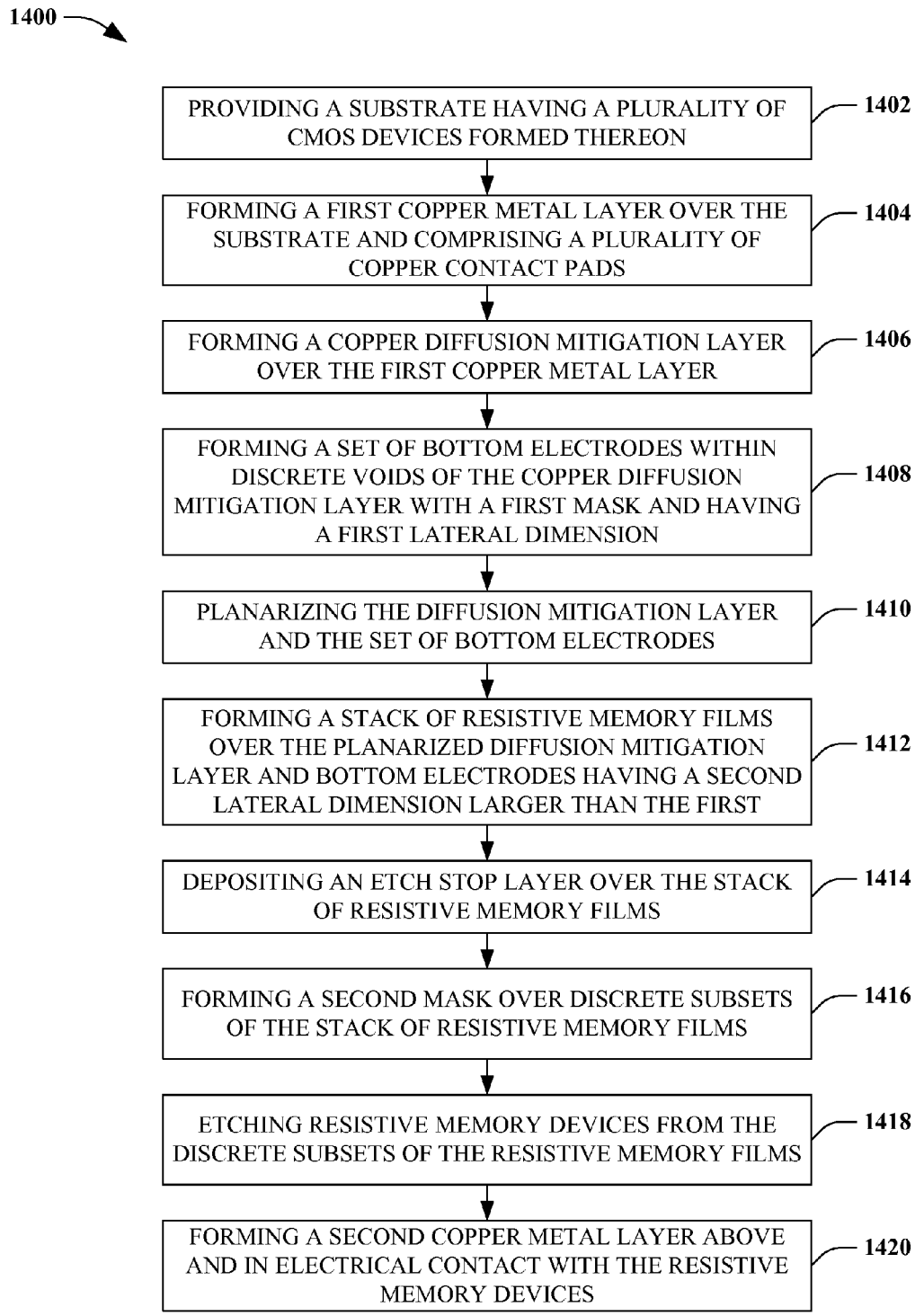
FIG. 14 illustrates a flowchart of an example method for fabricating memory between backend copper metal layers of a memory device, in an embodiment.

Referring now to FIG. 14, there is depicted a flowchart of a sample method 1400 for fabricating a memory device according to alternative or additional embodiments of the subject disclosure. At 1402, method 1400 can comprise providing a substrate having a plurality of CMOS devices formed thereon. At 1404, method 1400 can comprise forming a first copper metal layer over the substrate and comprising a plurality of copper contact pads. At 1406, method 1400 can comprise forming a copper diffusion mitigation layer over the first copper metal layer and, at 1408, method 1400 can comprise forming a set of bottom electrodes within discrete voids of the copper diffusion mitigation layer with a first mask and having a first lateral dimension (e.g., width, diameter, etc.). At 1410, method 1400 can comprise planarizing a top surface of the diffusion mitigation layer and the set of bottom electrodes. At 1412, method 1400 can comprise forming a stack of resistive memory films over the planarized diffusion mitigation layer and bottom electrodes, the stack of resistive memory films having a second lateral dimension larger than the first lateral dimension. At 1414, method 1400 can comprise depositing an etch stop layer the stack of resistive memory films. At 1416, method 1400 can comprise forming a second mask over discrete subsets of the stack of resistive memory films. At 1418, method 1400 can comprise etching resistive memory devices from the discrete subsets of the resistive memory films. At 1420, method 1400 can comprise forming a second copper metal layer above and in electrical contact with the resistive memory devices.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing.

Figure 15:
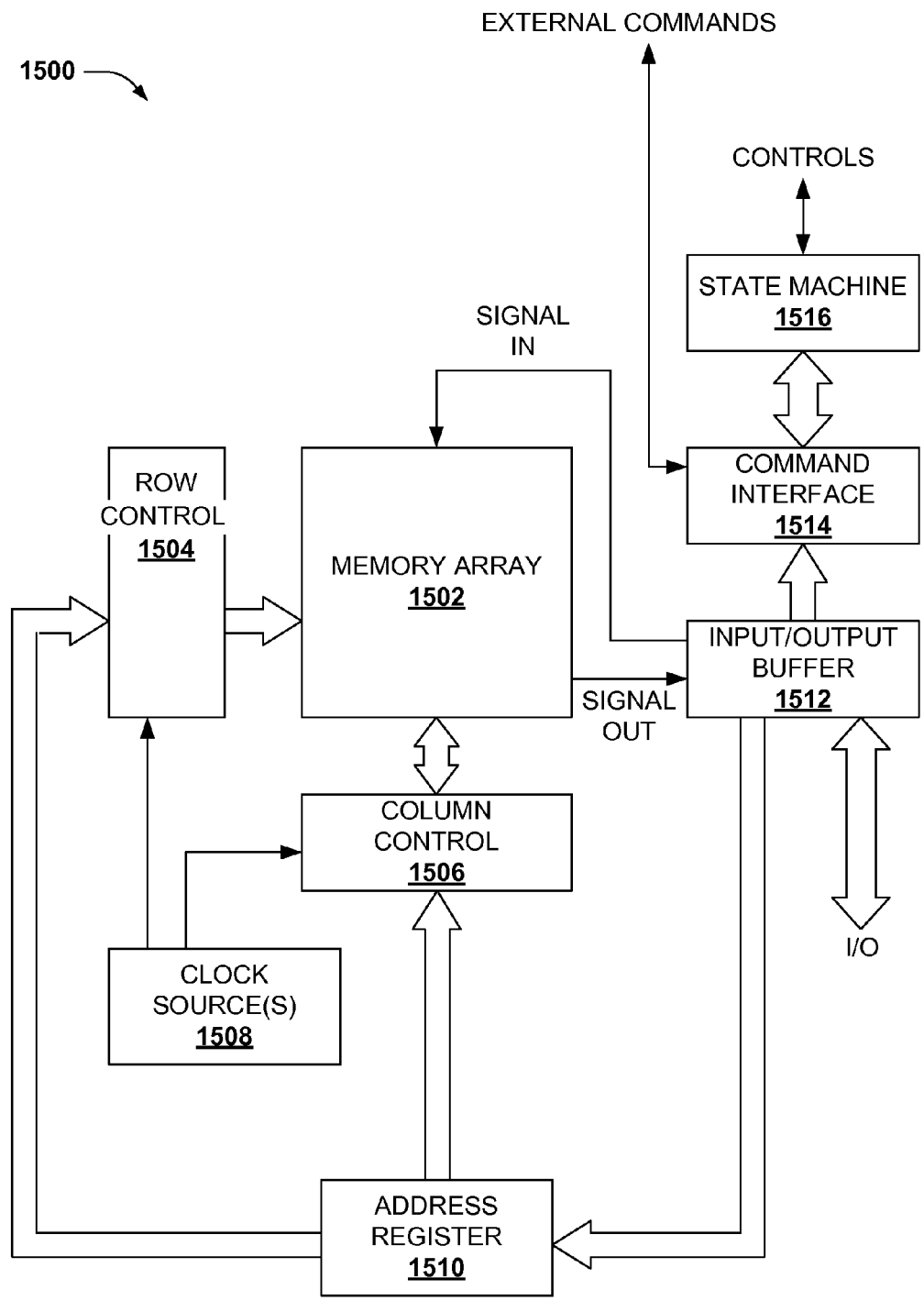
FIG. 15 depicts a block diagram of an example operating and control environment for a memory device according to disclosed embodiments.

In order to provide a context for the various aspects of the disclosed subject matter, FIG. 15, as well as the following discussion, is intended to provide a brief, general description of a suitable environment in which various aspects of the disclosed subject matter can be implemented or processed. While the subject matter has been described above in the general context of electronic memory or architectures and process methods for fabricating such memory or architectures, those skilled in the art will recognize that the subject disclosure also can be implemented in combination with other architectures or process methods. Moreover, those skilled in the art will appreciate that the disclosed processes can be practiced with a processing system or a computer processor, either alone or in conjunction with a host computer (e.g., computer 1602 of FIG. 16, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 15 illustrates a block diagram of an example operating and control environment 1500 for a memory cell array 1502 according to alternative or additional aspects of the subject disclosure. In at least one aspect of the subject disclosure, memory cell array 1502 can comprise a variety of memory cell technology. In at least one embodiment, memory cells of the memory cell technology can comprise two-terminal memory (e.g., resistive-switching memory, volatile resistive selection devices, etc.), arranged in a compact two or three dimensional architecture. In another embodiment, memory cell array 1502 or related components (e.g., memory registers, not depicted) can store operations or configurations related to implementing a memory fill operation, as described herein.

A column controller 1506 can be formed adjacent to memory cell array 1502. Moreover, column controller 1506 can be electrically coupled with bit lines of memory cell array 1502. Column controller 1506 can control respective bitlines, applying suitable program, erase or read voltages to selected bitlines.

In addition, operating and control environment 1500 can comprise a row controller 1504. Row controller 1504 can be formed adjacent to column controller 1506, and electrically connected with word lines of memory cell array 1502. Row controller 1504 can select particular rows of memory cells with a suitable selection voltage. Moreover, row controller 1504 can facilitate program, erase or read operations by applying suitable voltages at selected word lines.

A clock source(s) 1508 can provide respective clock pulses to facilitate timing for read, write, and program operations of row controller 1504 and column controller 1506. Clock source(s) 1508 can further facilitate selection of word lines or bit lines in response to external or internal commands received by operating and control environment 1500. An input/output buffer 1512 can be connected to an external host apparatus, such as a computer or other processing device (not depicted, but see e.g., computer 1602 of FIG. 16, infra) by way of an I/O buffer or other I/O communication interface. Input/output buffer 1512 can be configured to receive write data, receive an erase instruction, output readout data, and receive address data and command data, as well as address data for respective instructions. Address data can be transferred to row controller 1504 and column controller 1506 by an address register 1510. In addition, input data is transmitted to memory cell array 1502 via signal input lines, and output data is received from memory cell array 1502 via signal output lines. Input data can be received from the host apparatus, and output data can be delivered to the host apparatus via the I/O buffer.

Commands received from the host apparatus can be provided to a command interface 1514. Command interface 1514 can be configured to receive external control signals from the host apparatus, and determine whether data input to the input/output buffer 1512 is write data, a command, or an address. Input commands can be transferred to a state machine 1516.

State machine 1516 can be configured to manage programming and reprogramming of memory cell array 1502. State machine 1516 receives commands from the host apparatus via input/output buffer 1512 and command interface 1514, and manages read, write, erase, data input, data output, and similar functionality associated with memory cell array 1502. In some aspects, state machine 1516 can send and receive acknowledgments and negative acknowledgments regarding successful receipt or execution of various commands.

To implement read, write, erase, input, output, etc., functionality, state machine 1516 can control clock source(s) 1508. Control of clock source(s) 1508 can cause output pulses configured to facilitate row controller 1504 and column controller 1506 implementing the particular functionality. Output pulses can be transferred to selected bit lines by column controller 1506, for instance, or word lines by row controller 1504, for instance.

In connection with FIG. 16, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 16:
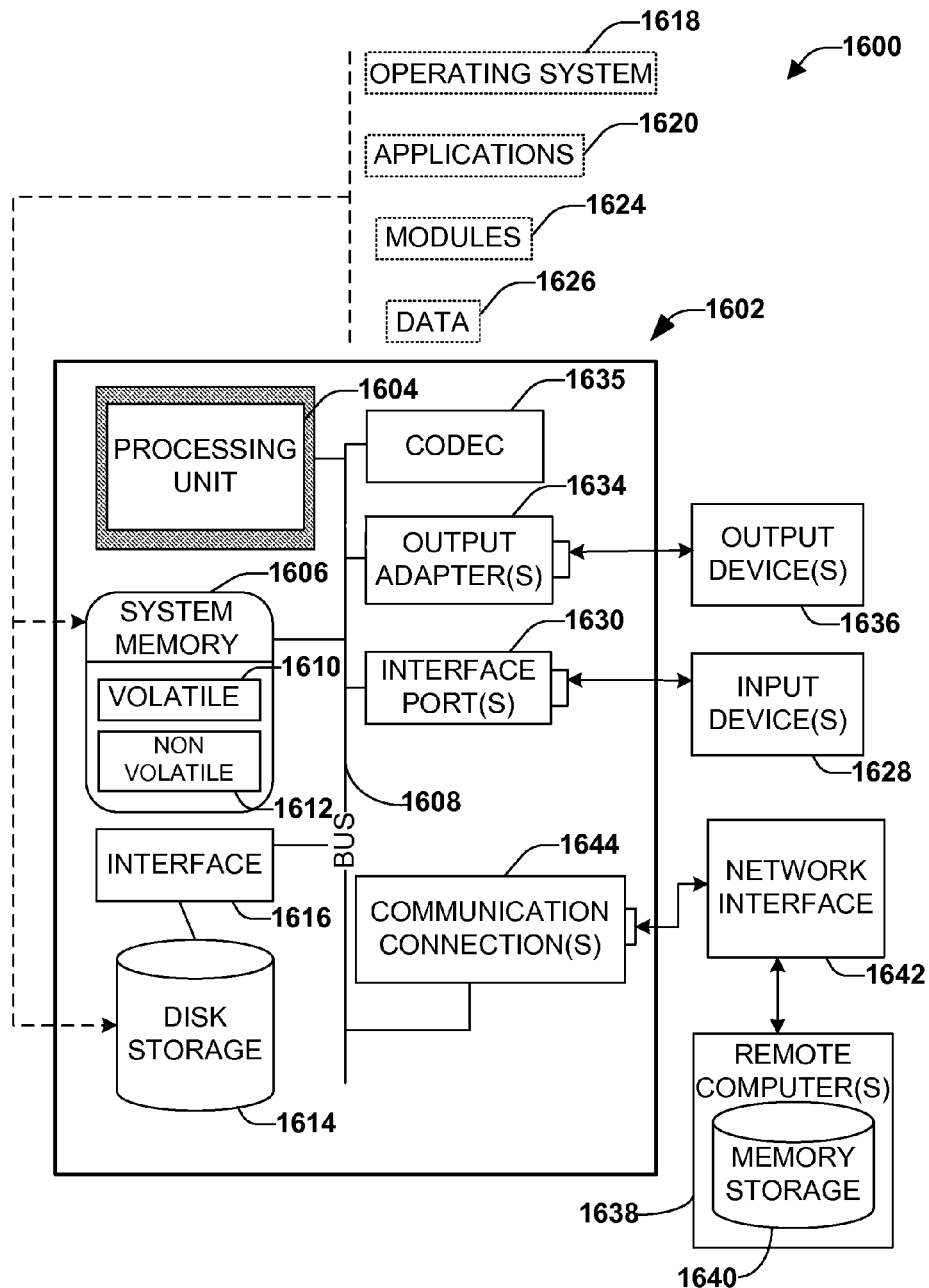
FIG. 16 illustrates a block diagram of an example computing environment that can be implemented in conjunction with various embodiments.

With reference to FIG. 16, a suitable operating environment 1600 for implementing various aspects of the claimed subject matter includes a computer 1602. The computer 1602 includes a processing unit 1604, a system memory 1606, a codec 1635, and a system bus 1608. The system bus 1608 couples system components including, but not limited to, the system memory 1606 to the processing unit 1604. The processing unit 1604 can be any of various available processors. Dual microprocessors and other multiprocessor architectures also can be employed as the processing unit 1604.

The system bus 1608 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1606 includes volatile memory 1610 and non-volatile memory 1614, which can employ one or more of the disclosed memory architectures, in various embodiments. The basic input/output system (BIOS), containing the basic routines to transfer information between elements within the computer 1602, such as during start-up, is stored in non-volatile memory 1612. In addition, according to present innovations, codec 1635 may include at least one of an encoder or decoder, wherein the at least one of an encoder or decoder may consist of hardware, software, or a combination of hardware and software. Although, codec 1635 is depicted as a separate component, codec 1635 may be contained within non-volatile memory 1612. By way of illustration, and not limitation, non-volatile memory 1612 can include read only memory (ROM), programmable ROM (PROM), electrically programmable ROM (EPROM), electrically erasable programmable ROM (EEPROM), or Flash memory. Non-volatile memory 1612 can employ one or more of the disclosed memory architectures, in at least some disclosed embodiments. Moreover, non-volatile memory 1612 can be computer memory (e.g., physically integrated with computer 1602 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1610 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1602 may also include removable/non-removable, volatile/non-volatile computer storage medium. FIG. 16 illustrates, for example, disk storage 1614. Disk storage 1614 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1614 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1614 to the system bus 1608, a removable or non-removable interface is typically used, such as interface 1616. It is appreciated that disk storage 1614 can store information related to a user. Such information might be stored at or provided to a server or to an application running on a user device. In one embodiment, the user can be notified (e.g., by way of output device(s) 1636) of the types of information that are stored to disk storage 1614 and/or transmitted to the server or application. The user can be provided the opportunity to opt-in or opt-out of having such information collected and/or shared with the server or application (e.g., by way of input from input device(s) 1628).

It is to be appreciated that FIG. 16 describes software that acts as an intermediary between users and the basic computer resources described in the suitable operating environment 1600. Such software includes an operating system 1618. Operating system 1618, which can be stored on disk storage 1614, acts to control and allocate resources of the computer 1602. Applications 1620 take advantage of the management of resources by operating system 1618 through program modules 1624, and program data 1626, such as the boot/shutdown transaction table and the like, stored either in system memory 1606 or on disk storage 1614. It is to be appreciated that the claimed subject matter can be implemented with various operating systems or combinations of operating systems.

A user enters commands or information into the computer 1602 through input device(s) 1628. Input devices 1628 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1604 through the system bus 1608 via interface port(s) 1630. Interface port(s) 1630 include, for example, a serial port, a parallel port, a game port, and a universal serial bus (USB). Output device(s) 1636 use some of the same type of ports as input device(s) 1628. Thus, for example, a USB port may be used to provide input to computer 1602 and to output information from computer 1602 to an output device 1636. Output adapter 1634 is provided to illustrate that there are some output devices, such as monitors, speakers, and printers, among other output devices, which require special adapters. The output adapter 1634 can include, by way of illustration and not limitation, video and sound cards that provide a means of connection between the output device 1636 and the system bus 1608. It should be noted that other devices and/or systems of devices provide both input and output capabilities such as remote computer(s) 1638.

Computer 1602 can operate in a networked environment using logical connections to one or more remote computers, such as remote computer(s) 1638. The remote computer(s) 1638 can be a personal computer, a server, a router, a network PC, a workstation, a microprocessor based appliance, a peer device, a smart phone, a tablet, or other network node, and typically includes many of the elements described relative to computer 1602. For purposes of brevity, only a memory storage device 1640 is illustrated with remote computer(s) 1638. Remote computer(s) 1638 is logically connected to computer 1602 through a network interface 1642 and then connected via communication connection(s) 1644. Network interface 1642 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1644 refers to the hardware/software employed to connect the network interface 1642 to the system bus 1608. While communication connection 1644 is shown for illustrative clarity inside computer 1602, it can also be external to computer 1602. The hardware/software necessary for connection to the network interface 1642 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for forming a resistive memory cell, comprising:
   providing a semiconductor substrate having a plurality of complementary metal oxide semiconductor (CMOS) devices formed thereon, and having a plurality of exposed copper conductor contact regions;
   forming a blocking layer over the semiconductor substrate and in physical contact with copper material of the copper conductor contact regions, wherein the blocking layer is configured to mitigate or prevent diffusion of the copper material through the blocking layer;
   forming a plurality of bottom electrodes within the blocking layer and in electrical contact with respective ones of at least a subset of the copper conductor contact regions, a bottom electrode of the plurality of bottom electrodes having a first width;
   disposing a set of resistive memory cell layers above the blocking layer, comprising:
      disposing a resistive switching material layer above and in physical contact with the plurality of bottom electrodes, and
      disposing an active metal material layer above and in physical contact with the resistive switching material layer;
   disposing and patterning an etch stop layer and forming discrete etch stop segments over portions of the active metal material layer, wherein the etch stop layer is in physical contact with the active metal material layer and an etch stop segment of the discrete etch stop segments overlying the bottom electrode has a second width larger than the first width;
   etching the set of resistive memory cell layers between the discrete etch stop segments to form a plurality of resistive memory structures, wherein respective resistive memory structures comprise the resistive switching material layer, the active metal material layer, and the etch stop layer and a resistive memory structure of the plurality of resistive memory structures overlying the bottom electrode has the second width larger than the first width;
   depositing a first dielectric layer above and between the plurality of resistive memory structures;
   etching the first dielectric layer to expose top surfaces of the respective etch stop layers of the plurality of resistive memory structures resulting in a top surface of the first dielectric layer to be substantially coplanar to the exposed top surfaces of the respective etch stop layers;
   depositing a second dielectric layer above at least a portion of the first dielectric layer and above and in physical contact with the top surface of the first dielectric layer and with the exposed top surfaces of the respective etch stop layers of the plurality of resistive memory structures;
   forming and patterning a mask layer above discrete mask portions of the second dielectric layer;
   etching at least a portion of the second dielectric layer in response to the mask layer to form a plurality of contact vias, wherein contact vias of the plurality of contact vias expose at least respective portions of the etch stop layers of the plurality of resistive memory structures; and
   forming respective copper metal layers within the plurality of contact vias, wherein the copper metal layers are respectively in electrical contact with the portions of the etch stop layers of the plurality of resistive memory structures.

2. The method of claim 1, wherein a resistive switching material of the resistive switching material layer is selected from a group consisting of: undoped amorphous silicon, non-crystalline silicon, and non-stoichiometric silicon oxide.

3. The method of claim 1, wherein an active metal material of the active metal material layer is selected from a group consisting of: silver metal or alloy, copper metal or alloy suitable for etching, aluminum metal or alloy, and gold metal or alloy.

4. The method of claim 1, wherein the disposing the set of resistive memory cell layers further comprises depositing respective two-terminal volatile selection devices above and in electrical series contact with the active metal material layer, wherein the selection devices are formed from a layer comprising at least one of Cu, Al, Ti, W, Ag, Ni, a solid electrolyte, a silicon sub-oxide, $Al_2O_3$, $HfO_2$, or ZnO.

5. The method of claim 1, further comprising:
   forming and patterning a second mask layer above an additional discrete mask portion of the second dielectric layer, the additional discrete mask portion being adjacent to and in contact with one of the contact vias; and
   etching at least a portion of the first dielectric layer and the second dielectric layer in response to the second mask layer to form a vertical via in the second dielectric layer, the first dielectric layer, and the blocking layer to expose at least a portion of one of another subset of the copper conductor contact regions distinct from the subset; wherein forming the respective copper metal layers within the plurality of contact vias further comprises filling the vertical via with a copper metal contacting the portion of the one of the other subset of the copper conductor contact regions.

6. The method of claim 1, further comprising forming a barrier layer within the plurality of contact vias interposed between the copper metal layer, and the second dielectric layer and respective etch stop layers.

7. The method of claim 1, wherein forming the plurality of bottom electrodes within the blocking layer further comprises:
   forming a set of via grooves within the blocking layer of the semiconductor substrate;
   filling the set of via grooves with a conductive material selected from a group consisting of: doped polysilicon, doped polycrystalline SiGe, Si, TiN, TaN, Pt and Cu;
   planarizing the blocking layer and filled via grooves to expose a top surface of the blocking layer and of the conductive material.

8. The method of claim 1
   wherein the disposing the set of resistive memory cell layers further comprises disposing respective two-terminal volatile selection devices above and in electrical series contact with the active material layer;
   wherein disposing the respective two-terminal volatile selection devices comprises:
   forming a first selection electrode;
   forming a volatile switching layer above and in contact with the first selection electrode; and forming a second selection electrode above and in contact with the volatile switching layer.

9. The method of claim 8 wherein the forming the first selection electrode comprises forming a layer of material selected from a group consisting of: a silver compound, a metal-oxide alloy, and a copper compound.

10. The method of claim 8 wherein the forming the volatile switching layer comprises forming a layer of material selected from a group consisting of: a non-stoichiometric metal-oxide, a non-stoichiometric metal-nitride, and a non-stoichiometric silicon sub-oxide.

11. The method of claim 1 wherein providing the semiconductor substrate comprises forming the plurality of exposed copper conductor contact regions on top of the semiconductor substrate, wherein the exposed copper conductor contact regions comprise a backend metal layer.

12. The method of claim 1, wherein the respective copper metal layers within the plurality of contact vias comprise a backend metal layer.

13. A method of forming a device including embedded resistive memory, comprising:
providing a substrate having a plurality of CMOS devices formed thereon;
forming a first copper metal layer over the substrate and comprising a plurality of copper contact pads;
forming a plurality of resistive memory devices over a portion of surface area of the substrate and in contact with respective ones of a corresponding subset of the plurality of copper contact pads within the portion of the surface area, wherein the plurality of resistive memory devices are formed using two, three or four photo-resist mask layers and further wherein the respective resistive memory devices comprise, a bottom electrode in a void of a copper diffusion mitigation layer and in electrical contact with a copper contact pad of the plurality of copper contact pads and having a first lateral dimension, wherein a top surface of the bottom electrode is substantially coplanar with a top surface of the copper diffusion mitigation layer and wherein a bottom surface of the bottom electrode and a bottom surface of the copper diffusion mitigation layer are in physical contact with copper material of the first copper metal layer, a resistive switching material layer is in physical contact with the bottom electrode, an active metal material layer is above and in physical contact with the resistive switching material layer, an etch stop layer is above and in physical contact with the active metal material layer, wherein the resistive switching material layer, active metal material layer and etch stop layer are etched to form a plurality of resistive memory device stacks respectively embodying the plurality of resistive memory devices, wherein a resistive memory device stack of the plurality of resistive memory device stacks has an etch stop layer segment with a top surface that is substantially coplanar with a top surface of an interlayer dielectric material located between resistive memory device stacks of the plurality of resistive memory device stacks, and further wherein the resistive memory device stack has a second lateral dimension larger than the first lateral dimension of the bottom electrode, and a first memory contact region at the top surface of the etch stop layer segment; and
forming a second copper metal layer above the plurality of resistive memory devices and a portion of the second copper metal layer in electrical contact with the first memory contact region.

14. The method of claim 13, wherein forming the plurality of resistive memory devices further comprises:
forming the copper diffusion mitigation layer over the first copper metal layer;
forming a set of bottom electrodes, which includes the bottom electrode, within discrete voids of the copper diffusion mitigation layer, which includes the void of the copper diffusion mitigation layer, utilizing an etch, fill and polish process, wherein forming the discrete voids within the copper diffusion mitigation layer utilizes a first photo-resist mask layer of the two, three or four photo-resist mask layers that forms the discrete voids respectively having the first lateral dimension;
forming the resistive switching material layer over the copper diffusion mitigation layer and set of bottom electrodes;
forming the active metal material layer over the resistive switching material layer;
depositing the etch stop layer over discrete portions of the active metal material layer, wherein the discrete portions respectively have the second lateral dimension larger than the first lateral dimension and cover respective ones of the set of bottom electrodes;
forming a second photo-resist mask layer of the two, three or four photo-resist mask layers over the discrete portions of the active metal material layer; and
etching the resistive switching material layer, the active metal material layer and the etch stop layer to form the plurality of resistive memory devices.

15. The method of claim 14, wherein a copper diffusion mitigation material of the copper diffusion mitigation layer is selected from a group consisting of SiN, SiC, SiCN.

16. The method of claim 13, wherein a resistive switching material of the resistive switching material layer is selected from a group consisting of: undoped amorphous silicon, non-crystalline silicon, and non-stoichiometric silicon oxide.

17. The method of claim 14, wherein the forming the active metal material layer comprises forming a first material layer selected from a first group consisting of: Cu, Cu alloy, Al, Al alloy, Pt, Pt alloy, Pd, and Pd alloy.

18. The method of claim 17 wherein forming the resistive switching material layer comprises forming a second material layer selected from a second group consisting of: a non-stoichiometric silicon oxide, and a non-stoichiometric oxide.

19. The method of claim 13 further comprising:
forming the interlayer dielectric material on top of and between the resistive memory device stacks;
etching the interlayer dielectric material to expose the top surface of the etch stop layer;
forming an additional interlayer dielectric material on top of the top surface of the etch stop layer and the top surface of the interlayer dielectric material;
etching the additional interlayer dielectric material and the interlayer dielectric material to form a first via exposing a top surface of another copper contact pad from the plurality of copper contact pads;
etching the additional interlayer dielectric material to form a second via exposing the top surface of the etch stop layer and to form a third via exposing a portion of the top surface of the interlayer dielectric material overlying the other copper contact pad;
forming a first interconnect structure in the first via and the third via; and
forming a second interconnect structure in the second via.

20. The method of claim 19 wherein forming the first interconnect structure comprises:
- disposing a liner material in the second via to contact the top surface of the other copper contact pad;
- disposing a copper material in the second via above the liner material; and
- planarizing the copper material and the liner material to expose the additional interlayer dielectric material.

\* \* \* \* \*